United States Patent
Tsuchiya

(10) Patent No.: US 11,637,406 B2
(45) Date of Patent: Apr. 25, 2023

(54) ELECTRICAL CONNECTOR AND METHOD FOR PRODUCING SAME

(71) Applicant: Shin-Etsu Polymer Co., Ltd., Tokyo (JP)

(72) Inventor: Masatoshi Tsuchiya, Saitama (JP)

(73) Assignee: SHIN-ETSU POLYMER CO., LTD., Tokyo (JP)

( * ) Notice: Subject to any disclaimer, the term of this patent is extended or adjusted under 35 U.S.C. 154(b) by 488 days.

(21) Appl. No.: 16/608,185

(22) PCT Filed: May 17, 2018

(86) PCT No.: PCT/JP2018/019101
§ 371 (c)(1),
(2) Date: Oct. 25, 2019

(87) PCT Pub. No.: WO2018/212277
PCT Pub. Date: Nov. 22, 2018

(65) Prior Publication Data
US 2021/0104854 A1    Apr. 8, 2021

(30) Foreign Application Priority Data

May 18, 2017  (JP) .............................. JP2017-098950

(51) Int. Cl.
*H01R 11/01* (2006.01)
*H01R 33/94* (2006.01)
(Continued)

(52) U.S. Cl.
CPC .............. *H01R 33/94* (2013.01); *B32B 3/263* (2013.01); *B32B 3/266* (2013.01); *B32B 27/06* (2013.01);
(Continued)

(58) Field of Classification Search
None
See application file for complete search history.

(56) References Cited

U.S. PATENT DOCUMENTS 3,795,037 A * 3/1974 Luttmer ............... H01R 12/714
333/260
4,778,950 A * 10/1988 Lee ..................... H01R 13/2414
439/91

(Continued)

FOREIGN PATENT DOCUMENTS

CN    101228667 A    7/2008
CN    101874129 A   10/2010
(Continued)

OTHER PUBLICATIONS

Machine Translation of JP-2007220512-A, Aug. 2007 (Year: 2007).*
(Continued)

*Primary Examiner* — Jeffrey A Vonch
(74) *Attorney, Agent, or Firm* — Hauptman Ham, LLP

(57) ABSTRACT

Provided is an electric connector, which is to be arranged between a connection terminal of a first device and a connection terminal of a second device, and is configured to electrically connect the connection terminal of the first device and the connection terminal of the second device to each other, the electric connector including a composite, the composite including: an elastic body having a plurality of through holes that penetrate therethrough in a thickness direction; and a conductive member, which is joined to an inner wall of each of the through holes, and is configured to electrically connect the connection terminal of the first device and the connection terminal of the second device to each other, wherein at least a part of a vicinity of at least one of distal ends of the conductive member is hollow.

12 Claims, 11 Drawing Sheets

(51) Int. Cl.
  *B32B 3/26* (2006.01)
  *B32B 27/06* (2006.01)
  *H01R 12/70* (2011.01)
  *H01R 43/20* (2006.01)
  *H05K 3/32* (2006.01)
  *H01R 43/00* (2006.01)
  *B32B 3/30* (2006.01)
  *H01R 43/18* (2006.01)
  *H01R 12/71* (2011.01)
  *H01R 13/03* (2006.01)
  *H01R 12/73* (2011.01)
  *H01R 13/24* (2006.01)
  *H01R 12/59* (2011.01)
  *H01R 39/24* (2006.01)
  *H01R 13/22* (2006.01)

(52) U.S. Cl.
  CPC ......... *H01R 11/01* (2013.01); *H01R 12/7076* (2013.01); *H01R 43/205* (2013.01); *B32B 3/30* (2013.01); *B32B 2307/202* (2013.01); *B32B 2307/51* (2013.01); *B32B 2457/00* (2013.01); *H01R 12/59* (2013.01); *H01R 12/714* (2013.01); *H01R 12/718* (2013.01); *H01R 12/73* (2013.01); *H01R 13/03* (2013.01); *H01R 13/22* (2013.01); *H01R 13/24* (2013.01); *H01R 39/24* (2013.01); *H01R 43/00* (2013.01); *H01R 43/18* (2013.01); *H01R 43/20* (2013.01); *H05K 3/325* (2013.01); *H05K 2201/026* (2013.01); *H05K 2201/0314* (2013.01); *H05K 2203/162* (2013.01); *Y10T 428/24273* (2015.01); *Y10T 428/24331* (2015.01); *Y10T 428/24479* (2015.01); *Y10T 428/24612* (2015.01); *Y10T 428/24744* (2015.01)

(56) References Cited

U.S. PATENT DOCUMENTS

| | | | | | |
|---|---|---|---|---|---|
| 5,049,084 | A * | 9/1991 | Bakke | ............ | H01R 12/714 |
| | | | | | 439/74 |
| 5,071,359 | A * | 12/1991 | Arnio | ............ | B23K 26/40 |
| | | | | | 439/91 |
| 5,245,751 | A * | 9/1993 | Locke | ............ | B23K 26/389 |
| | | | | | 29/852 |
| 5,600,884 | A * | 2/1997 | Kondo | ............ | H01L 23/49827 |
| | | | | | 29/829 |
| 5,698,496 | A * | 12/1997 | Fastnacht | ............ | H01R 13/2407 |
| | | | | | 505/739 |
| 6,168,442 | B1 * | 1/2001 | Naoi | ............ | H01R 13/2414 |
| | | | | | 439/91 |
| 6,245,175 | B1 * | 6/2001 | Hotta | ............ | H01R 43/007 |
| | | | | | 29/878 |
| 6,667,099 | B1 * | 12/2003 | Greiner | ............ | B01D 71/022 |
| | | | | | 428/397 |
| 6,774,315 | B1 * | 8/2004 | Pierson | ............ | H05K 7/1061 |
| | | | | | 257/774 |
| 10,916,521 | B2 * | 2/2021 | Hotta | ............ | H01R 13/03 |
| 2001/0032733 | A1 * | 10/2001 | Yamaguchi | ............ | H01R 43/007 |
| | | | | | 174/117 F |
| 2002/0106913 | A1 * | 8/2002 | Schuenemann | ............ | H01R 43/007 |
| | | | | | 439/67 |
| 2003/0080768 | A1 * | 5/2003 | Yamaguchi | ............ | G01R 1/0408 |
| | | | | | 324/755.01 |
| 2003/0098518 | A1 * | 5/2003 | Averdung | ............ | B01D 67/0037 |
| | | | | | 264/441 |
| 2004/0032271 | A1 * | 2/2004 | Blackwood | ............ | G01R 1/07321 |
| | | | | | 324/762.01 |
| 2004/0224148 | A1 * | 11/2004 | Matsunaga | ............ | H01R 13/2414 |
| | | | | | 428/332 |
| 2005/0077542 | A1 * | 4/2005 | Asai | ............ | H01L 23/49827 |
| | | | | | 257/200 |
| 2005/0106907 | A1 * | 5/2005 | Yamada | ............ | H01R 43/007 |
| | | | | | 439/91 |
| 2005/0132568 | A1 * | 6/2005 | Asai | ............ | H01R 43/007 |
| | | | | | 29/605 |
| 2006/0141159 | A1 * | 6/2006 | Okuda | ............ | H05K 3/0055 |
| | | | | | 427/331 |
| 2006/0160383 | A1 * | 7/2006 | Yamada | ............ | G01R 1/06755 |
| | | | | | 439/86 |
| 2006/0162287 | A1 * | 7/2006 | Hasegawa | ............ | H01R 13/2414 |
| | | | | | 53/362 |
| 2006/0251871 | A1 * | 11/2006 | Masuda | ............ | H01R 43/007 |
| | | | | | 428/209 |
| 2007/0160808 | A1 * | 7/2007 | Okuda | ............ | H01R 13/2414 |
| | | | | | 428/137 |
| 2007/0228926 | A1 * | 10/2007 | Teo | ............ | B81C 1/00095 |
| | | | | | 257/E23.021 |
| 2009/0081419 | A1 * | 3/2009 | Idomoto | ............ | H01R 12/7076 |
| | | | | | 428/195.1 |
| 2009/0223701 | A1 * | 9/2009 | Idomoto | ............ | H05K 3/0014 |
| | | | | | 428/137 |
| 2009/0269549 | A1 * | 10/2009 | Fujita | ............ | H01R 13/035 |
| | | | | | 428/137 |
| 2010/0264036 | A1 * | 10/2010 | Hatanaka | ............ | C25D 11/045 |
| | | | | | 205/221 |
| 2011/0107596 | A1 * | 5/2011 | Chou | ............ | H05K 1/118 |
| | | | | | 29/846 |
| 2011/0117357 | A1 * | 5/2011 | Hatanaka | ............ | H01L 24/83 |
| | | | | | 205/112 |
| 2012/0073973 | A1 * | 3/2012 | Yamashita | ............ | C25D 11/20 |
| | | | | | 205/78 |
| 2012/0152593 | A1 * | 6/2012 | Nakaone | ............ | H01L 23/49827 |
| | | | | | 174/250 |
| 2013/0092424 | A1 * | 4/2013 | Masuda | ............ | H01R 43/007 |
| | | | | | 216/13 |
| 2014/0217643 | A1 * | 8/2014 | Nikawa | ............ | C01B 32/168 |
| | | | | | 423/447.2 |
| 2015/0306690 | A1 * | 10/2015 | Qian | ............ | B23H 7/08 |
| | | | | | 219/69.12 |
| 2015/0310957 | A1 * | 10/2015 | Qian | ............ | H01B 5/14 |
| | | | | | 174/126.2 |
| 2018/0044819 | A1 * | 2/2018 | Inoue | ............ | D02G 3/36 |
| 2018/0113152 | A1 * | 4/2018 | Suzuki | ............ | G01R 1/0735 |
| 2019/0218667 | A1 * | 7/2019 | Mizoguchi | ............ | C23F 1/00 |

FOREIGN PATENT DOCUMENTS

| | | | | |
|---|---|---|---|---|
| CN | 103219067 | A * | 7/2013 | |
| CN | 103392272 | A | 11/2013 | |
| CN | 204066767 | U * | 12/2014 | |
| DE | 19910985 | A1 * | 9/2000 | ............ C25D 1/02 |
| EP | 726621 | A2 * | 8/1996 | ............ H01L 21/486 |
| EP | 1732168 | A1 * | 12/2006 | ............ H01R 13/2414 |
| JP | 55080514 | A * | 6/1980 | ............ B01D 71/10 |
| JP | 61259466 | A * | 11/1986 | ............ H01R 13/2414 |
| JP | 63058708 | A * | 3/1988 | ............ H01L 21/486 |
| JP | 01097382 | A * | 4/1989 | |
| JP | 03285211 | A * | 12/1991 | |
| JP | 03293736 | A * | 12/1991 | |
| JP | 05243418 | A * | 9/1993 | |
| JP | 06251848 | A * | 9/1994 | |
| JP | 06264286 | A * | 9/1994 | |
| JP | 06264287 | A * | 9/1994 | |
| JP | H1022034 | A | 1/1998 | |
| JP | 2787032 | B2 | 8/1998 | |
| JP | 10284156 | A * | 10/1998 | |
| JP | 11167945 | A * | 6/1999 | |
| JP | 2000012619 | A * | 1/2000 | |
| JP | 2001223041 | A * | 8/2001 | |
| JP | 2001266669 | A * | 9/2001 | |
| JP | 2002008749 | A * | 1/2002 | |
| JP | 2002124319 | A * | 4/2002 | |
| JP | 2003022849 | A * | 1/2003 | |
| JP | 2003-59611 | A | 2/2003 | |
| JP | 2003163047 | A * | 6/2003 | |
| JP | 2003193335 | A * | 7/2003 | |

(56) References Cited

FOREIGN PATENT DOCUMENTS

| | | | | | |
|---|---|---|---|---|---|
| JP | 2004055514 | A | * | 2/2004 | ........... G01R 1/0416 |
| JP | 2004265844 | A | * | 9/2004 | ........... G01R 1/0408 |
| JP | 2004327292 | A | * | 11/2004 | |
| JP | 2005142111 | A | * | 6/2005 | |
| JP | 2005276696 | A | * | 10/2005 | |
| JP | 2006108039 | A | * | 4/2006 | |
| JP | 2006156196 | A | * | 6/2006 | |
| JP | 2007188841 | A | * | 7/2007 | |
| JP | 2007-220512 | A | | 8/2007 | |
| JP | 2007220512 | A | * | 8/2007 | |
| JP | 2007287375 | A | * | 11/2007 | |
| JP | 2008-59895 | A | | 3/2008 | |
| JP | 2008140574 | A | * | 6/2008 | |
| JP | 2009007461 | A | * | 1/2009 | |
| JP | 2009289730 | A | * | 12/2009 | |
| JP | 2010061857 | A | * | 3/2010 | |
| JP | 2010073472 | A | * | 4/2010 | |
| JP | 2010-153263 | A | | 7/2010 | |
| JP | 2012022828 | A | * | 2/2012 | |
| JP | 2012204285 | A | * | 10/2012 | |
| JP | 2014071962 | A | * | 4/2014 | |
| JP | 2016207653 | A | * | 12/2016 | |
| KR | 2004040835 | A | * | 5/2004 | |
| KR | 1020110139119 | A | | 12/2011 | |
| KR | 2012037593 | A | * | 4/2012 | |
| TW | 200938481 | A | * | 9/2009 | |
| WO | WO-2005102095 | A1 | * | 11/2005 | ........... B21C 37/042 |
| WO | WO-2006132063 | A1 | * | 12/2006 | ........... H01L 23/145 |
| WO | WO-2015045469 | A1 | * | 4/2015 | ......... C23C 18/1653 |
| WO | WO-2017002354 | A1 | * | 1/2017 | ............. H01R 11/01 |
| WO | WO-2017084562 | A1 | * | 5/2017 | ............. H01R 12/52 |

OTHER PUBLICATIONS

Machine Translation of JP-2008140574-A, Jun. 2008 (Year: 2008).*
Machine Translation of JP-2009007461-A, Jan. 2009 (Year: 2009).*
Machine Translation of JP-2014071962-A, Apr. 2014 (Year: 2014).*
Machine Translation of TW-200938481-A, Sep. 2009 (Year: 2009).*
Machine Translation of WO-2017084562-A1, May 2017 (Year: 2017).*
International Search Report in PCT Application No. PCT/JP2018/019101, dated Aug. 7, 2018, 4pp.

* cited by examiner

ELECTRICAL CONNECTOR AND METHOD FOR PRODUCING SAME

RELATED APPLICATIONS

The present application is a National Phase of International Application Number PCT/JP2018/019101, filed May 17, 2018, and claims priority based on Japanese Patent Application No. 2017-098950, filed May 18, 2017.

TECHNICAL FIELD

This disclosure relates to an electric connector and a method of manufacturing an electric connector.

This application claims priority from Japanese Patent Application No. 2017-098950, filed on May 18, 2017, the contents of which are incorporated herein by reference in their entirety.

BACKGROUND ART

When a surface mount type semiconductor package and a circuit board are inspected, or when the surface mount type semiconductor package and the circuit board are connected to each other, a pressure contact type connector is used.

As such connector, for example, there has been known a pressure contact type connector (see, for example, Patent Literature 1). A plurality of sheets, in which a plurality of conductive wires (conductive members) are wired so as to be aligned with each other in the same direction with insulation kept therebetween, are laminated on one another so that the conductive wires are arranged in a certain direction. A plurality of obtained laminates are arrayed, laminated, and integrated in a stepped shape at a certain angle with the directions of the conductive wires being aligned with each other, to obtain a block body. The obtained block body is caused to adhere to a substrate surface for slicing, and the block body is cut on two parallel surfaces traversing the conductive wires in parallel to the substrate surface.

CITATION LIST

Patent Literature

[PTL 1] JP 2787032 B2

SUMMARY OF INVENTION

Technical Problem

The pressure contact type connector described in Patent Literature 1 has a problem in that, at the time of connecting the pressure contact type connector to a connection terminal of a device, an excessive force is applied to the connection terminal from a conductive member of the pressure contact type connector. In addition, the pressure contact type connector has a problem in that it is difficult to stably connect the pressure contact type connector to the connection terminal of the device.

This disclosure has been made in view of the above-mentioned circumstances, and has an object to provide an electric connector that enables stable connection without application of an excessive force to a connection terminal of a device to be connected to the electric connector from a conductive member of the electric connector, and a method of manufacturing the electric connector.

Solution to Problem

[1] An electric connector, which is to be arranged between a connection terminal of a first device and a connection terminal of a second device, and is configured to electrically connect the connection terminal of the first device and the connection terminal of the second device to each other, the electric connector including a composite, the composite including:

an elastic body having a plurality of through holes that penetrate therethrough in a thickness direction; and a conductive member, which is joined to an inner wall of each of the through holes, and is configured to electrically connect the connection terminal of the first device and the connection terminal of the second device to each other, wherein at least apart of a vicinity of at least one of distal ends of the conductive member is hollow.

[2] The electric connector according to [1], wherein the conductive member has at least one metal layer made of a noble metal.

[3] The electric connector according to [1] or [2], wherein each of the through holes penetrates through the elastic body obliquely to a thickness direction of the elastic body.

[4] The electric connector according to any one of [1] to [3], wherein the conductive member includes an end portion that protrudes from at least one of one principal surface and another principal surface of the elastic body.

[5] The electric connector according to any one of [1] to [4], wherein the end portion of the conductive member has a plated layer formed thereon.

[6] The electric connector according to any one of [1] to [5], wherein the composite includes, on the one principal surface and the another principal surface of the elastic body, a plurality of conductive regions each including the through holes, each of the through holes having the conductive member joined thereto, and a non-conductive region, which is formed between the plurality of conductive regions, and includes the through holes, each of the through holes being free of the conductive member.

[7] The electric connector according to any one of [1] to [6], wherein the composite includes a protruding portion that protrudes in the thickness direction of the elastic body on at least the one principal surface side of the elastic body.

[8] The electric connector according to [7], further including a sheet-shaped member made of a resin, which is laminated on at least a part of a thin layer portion having a thickness smaller than a thickness of the protruding portion, on at least the one principal surface side of the elastic body.

[9] The electric connector according to any one of [1] to [8], wherein the conductive member is hollow over an entire length of the conductive member.

[10] A method of manufacturing an electric connector, including:

arranging a plurality of composite members each including a core member and a conductive member, which has at least one metal layer made of a noble metal formed on an outer peripheral surface of the core member, on a first surface side of a first resin layer formed of an elastic member at suitable intervals with the plurality of composite members being aligned with each other in the same direction;

forming a second resin layer formed of an elastic body on the first surface side of the first resin layer, to thereby form a conductive member-containing sheet;

laminating a plurality of conductive member-containing sheets on one another with the plurality of composite members being aligned with each other in the same direction, to thereby form a laminate of the plurality of conductive member-containing sheets;

cutting the laminate in a perpendicular direction or an oblique direction with respect to an extending direction the plurality of composite members, to thereby obtain a precursor sheet; and removing at least a part of the core member from the precursor sheet to obtain the electric connector.

[11] The method of manufacturing an electric connector according to [10], wherein the removing at least a part of the core members includes dissolving at least a part of the core member in a solution.

[12] The method of manufacturing an electric connector according to [10] or [11], further including causing an end portion of the conductive member included in the precursor sheet to protrude from at least one of a cut surface of the precursor sheet and a surface on an opposite side of the cut surface.

[13] The method of manufacturing an electric connector according to any one of [10] to [12], further including subjecting the end portion of the conductive member to plating.

[14] The method of manufacturing an electric connector according to any one of [10] to [13], including:

forming a masking layer on at least a part of one principal surface and another principal surface of the electric connector;

removing the conductive member in a portion in which the masking layer is prevented from being formed in the electric connector, to thereby form, in the electric connector, a non-conductive region including the through holes, each of the through holes being free of the conductive member, on the one principal surface and the another principal surface of the electric connector; and removing the masking layer to form, in the electric connector, a plurality of conductive regions each including the through holes, each of the through holes having the conductive member joined thereto, with the non-conductive region interposed between the plurality of conductive regions, on the one principal surface and the another principal surface of the electric connector.

[15] The method of manufacturing an electric connector according to any one of [10] to [14], further including removing a part of the electric connector in a thickness direction from at least one principal surface side of the electric connector, to thereby form a thin layer portion in the electric connector.

[16] The method of manufacturing an electric connector according to [15], further including laminating a sheet-shaped member made of a resin on the thin layer portion.

[17] The electric connector according to any one of [1] to [9], wherein the conductive member has a thickness of preferably from 0.05 µm to 25 µm, more preferably from 0.1 µm to 20 µm, still more preferably from 0.5 µm to 15 µm, particularly preferably from 1 µm to 5 µm.

[18] The electric connector according to any one of [3] to [9] and [17], wherein an angle of each of the through holes with respect to a normal to one principal surface of the elastic body is preferably more than 0° and 60° or less, more preferably 1° or more and 60° or less, still more preferably 10° or more and 30° or less.

[19] The electric connector according to any one of [1] to [9] and [17] and [18], wherein a center-to-center distance between the adjacent two conductive members is from 6 µm to 1,000 µm.

[20] The method of manufacturing an electric connector according to any one of [10] to [16], wherein the solution contains at least one kind selected from the group consisting of nitric acid, water, an acid, an alkali, and an organic solvent.

[21] The method of manufacturing an electric connector according to any one of [10] to [16] and [20], wherein the core member contains at least one kind selected from the group consisting of iron, copper, aluminum, lead, zinc, tin, tungsten, and polyvinyl alcohol.

Advantageous Effects of Invention

According to this disclosure, an electric connector that enables stable connection without application of an excessive force to a connection terminal of a device to be connected to the electric connector from a conductive member of the electric connector, and a method of manufacturing the electric connector can be provided.

BRIEF DESCRIPTION OF DRAWINGS

FIGS. 1A to 1C are each a view for illustrating a schematic configuration of an electric connector according to a first embodiment, in which FIG. 1A is a plan view, FIG. 1B is an enlarged view of a region a in FIG. 1A, and FIG. 1C is a sectional view taken along the line A-A of FIG. 1A.

DESCRIPTION OF EMBODIMENTS

An electric connector and a method of manufacturing the electric connector according to embodiments of this disclosure are described.

In this embodiment, specific description is given in order to make the spirit of this disclosure understood well, and the following embodiments do not limit this disclosure unless otherwise specified.

First Embodiment

[Electric Connector]

Figure 1A:
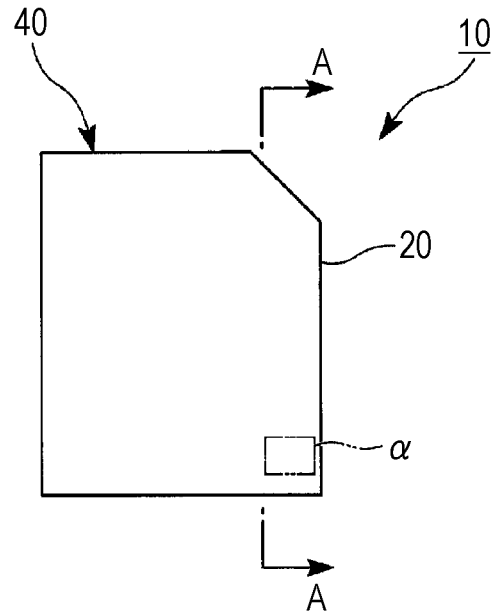
Figure 1B:
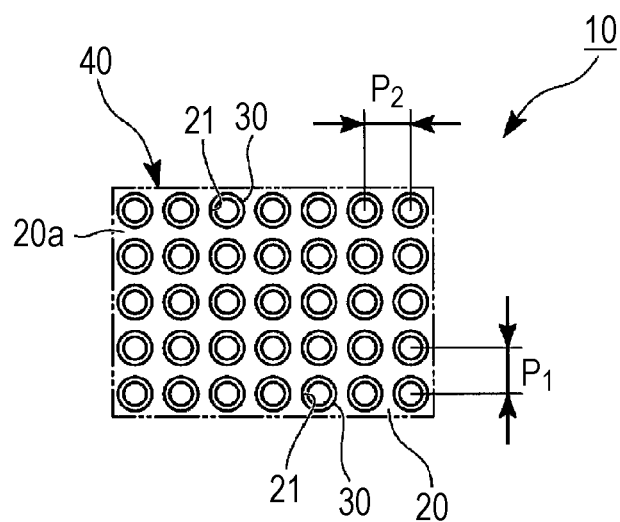
Figure 1C:
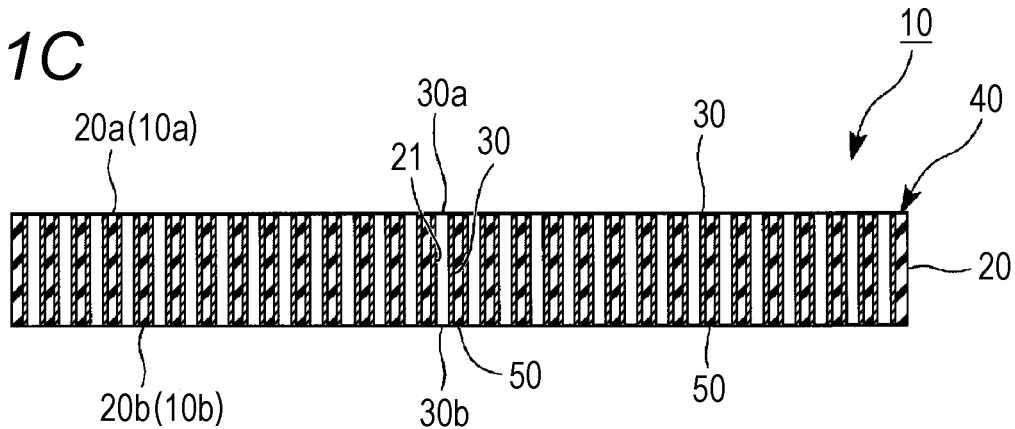

FIGS. 1A to 1C are each a view for illustrating a schematic configuration of an electric connector according to this embodiment. FIG. 1A is a plan view. FIG. 1B is an enlarged view of a region a in FIG. 1A. FIG. 1C is a sectional view taken along the line A-A of FIG. 1A.

As illustrated in FIGS. 1A to 1C, an electric connector 10 according to this embodiment includes a composite 40 including an elastic body 20 and conductive members 30.

The electric connector 10 is to be arranged between a connection terminal of a first device (not shown) and a connection terminal of a second device (not shown), and is configured to electrically connect the connection terminal of the first device and the connection terminal of the second device to each other. In the electric connector 10, the conductive members 30 are conductive members configured to electrically connect the connection terminal of the first device and the connection terminal of the second device to each other. As the devices, there are given, for example, a semiconductor package and a circuit board.

The elastic body 20 has a plurality of through holes 21 that penetrate through the elastic body 20 along a thickness direction thereof. The conductive member 30 is joined to an inner wall of each of the through holes 21. The term "joining" as used herein means a state in which at least a part of the conductive member 30 is held in contact with the inner wall of each of the through holes 21.

The positions at which the conductive members 30 are provided in the elastic body 20 (composite 40), that is, the arrangement of the through holes 21 in the elastic body 20 are not particularly limited, and are appropriately adjusted in accordance with the arrangement of the connection terminals of two devices to be electrically connected by the electric connector 10 (specifically conductive members 30 joined to the through holes 21), and the like. In order to cause the composite 40 to be uniformly deformed (warped), it is preferred that the conductive members 30 (through holes 21) be arranged at equal intervals in the elastic body 20.

The number of the conductive members 30 in the elastic body 20 (composite 40), that is, the number of the through holes 21 in the elastic body 20 is not particularly limited, and is appropriately adjusted in accordance with the arrangement of the connection terminals of the two devices to be electrically connected by the electric connector 10 (specifically conductive members 30 joined to the through holes 21), the required pressing force of the conductive members 30 with respect to the connection terminal, and the like.

The through holes 21 penetrate through the elastic body 20 in parallel to or obliquely to the thickness direction of the elastic body 20. The term "thickness direction of the elastic body 20" as used herein means a direction perpendicular to a principal surface. The term "principal surface" as used herein means a surface having the largest area.

When the through hole 21 penetrates through the elastic body 20 obliquely to the thickness direction thereof, an angle on an acute angle side of the through hole 21 with respect to the thickness direction of the elastic body 20, with respect to a normal to one principal surface 20a, is preferably more than 0° and 60° or less, more preferably 1° or more and 60° or less, still more preferably 10° or more and 30° or less. When the angle falls within the above-mentioned range, stable connection is more likely to be obtained with a low load, and there is a low risk in that terminals of a device to be connected to the electric connector 10 may be damaged. The angle of the through hole 21 with respect to the thickness direction of the elastic body 20 is appropriately adjusted in accordance with the arrangement of connection terminals of two devices to be electrically connected to each other by the electric connector 10 (specifically, conductive members 30 joined to the through holes 21), and the like. In this case, the angle of the through hole 21 with respect to the thickness direction of the elastic body 20 is a value obtained by measuring angles of five through holes 21 with respect to the thickness direction of the elastic body 20 based on an image obtained by observing the through holes 21 with magnifying observation means such as a digital microscope and averaging the angles.

The shape of the through hole 21, that is, the shape of a cross section perpendicular to a longitudinal direction of the through hole 21 is not particularly limited, and is appropriately adjusted in accordance with the shape of a cross section perpendicular to a longitudinal direction of the conductive member 30 joined to the through hole 21. As the shape of the cross section perpendicular to the longitudinal direction of the through hole 21, there are given, for example, a circular shape, an elliptic shape, a triangular shape, a square shape, a rectangular shape, and polygonal shapes of a pentagonal shape or more.

A hole diameter of the through hole 21 is not particularly limited, and is appropriately adjusted in accordance with a diameter (outer diameter) of the conductive member 30 joined to the through hole 21. It is preferred that the hole diameter of the through hole 21 be from 5 μm to 300 μm. When the shape of the through hole 21 is a shape other than a circular shape, the hole diameter of the through hole 21 is defined as a length of a portion having the largest width of an outer edge of the through hole 21 (edge portion of an opening).

It is preferred that the elastic body 20 have a thickness of from 0.03 mm to 5 mm. When the conductive members 30 do not protrude from a principal surface of the elastic body 20, the thickness of the composite 40 is equal to that of the elastic body 20. When the conductive members 30 protrude from the principal surface of the elastic body 20, the thickness of the elastic body 20 is regarded as the thickness of the composite 40.

The thickness of the composite 40 is preferably from 30 μm to 5 mm, more preferably from 50 μm to 1 mm, still more preferably from 70 µm to 500 µm, most preferably from 100 µm to 250 µm. When the thickness is equal to or more than a lower limit value of the above-mentioned thickness range, the mechanical strength and stiffness of the electric connector are improved, and it becomes easier to handle the electric connector. When the thickness is equal to or lower than an upper limit value of the above-mentioned thickness range, the length of the conductive member becomes suitable for improving high-frequency characteristics.

The term "thickness" as used herein is a value obtained by measuring thicknesses at five positions with magnifying observation means such as a digital microscope and averaging the thicknesses.

In the conductive member 30, a vicinity of at least one of distal ends on a connection terminal side of a first device and a connection terminal side of a second device, that is, at least a part of a vicinity of at least one of distal ends on one principal surface 20a side and the another principal surface 20b side of the elastic body 20 is a hollow body 50. The term "vicinity of a distal end" as used herein means a range from the distal end of the conductive member to a half of the entire length of the conductive member. The expression "at least a part is a hollow body" as used herein means that at least a part of the conductive member is hollow. It is only required that, in the conductive member 30, the hollow body 50 be formed in at least a part of a vicinity of a distal end at least on a side of an object to be measured among the connection terminal of the first device and the connection terminal of the second device. It is preferred that the hollow body 50 be formed in at least apart of the vicinity of the distal ends on the connection terminal side of the first device and the connection terminal side of the second device. In addition, the hollow body 50 is not always required to be formed continuously in the conductive member 30 and may be formed discontinuously. Each of composite members 30' includes, for example, a core member and the conductive member 30 having at least one metal layer made of a noble metal formed on an outer peripheral surface of the core member. In at least a part of the vicinity of at least one of distal ends on the one principal surface 20a side and the another principal surface 20b side of the elastic body 20, the core member is removed from the composite member 30', and the composite member 30' becomes the hollow body 50 formed of only the conductive member 30 having the metal layer. Specifically, in the conductive member 30, at least a part of the vicinity of at least one of distal ends on the one principal surface 20a side and the another principal surface 20b side of the elastic body 20 may be the hollow body 50, and the other portion may be solid (state in which the core member is filled in an inner side of the conductive member formed of the metal layer formed on the outer peripheral surface of the core member, and the inner side of the conductive member is not hollow). In order to obtain uniform conductivity and flexibility over the entire length of the conductive member 30, it is preferred that the hollow body 50 apply a load, which is required for obtaining a stable contact resistance value between the object to be measured and the electric connector 10, to the object to be measured, and compress the electric connector 10 in the thickness direction. In this case, it is preferred that (distance by which electric connector (elastic body) be compressed in thickness direction (distance of pressing direction of electric connector)) (total length of hollow body along thickness direction of electric connector (in direction perpendicular to one principal surface of elastic body) be satisfied. Specifically, when the electric connector 10 (elastic body 20) is compressed in the thickness direction, it is preferred that the compressed distance be equal to or less than the total length of the hollow body 50 along the thickness direction of the electric connector 10. As the total length of the hollow body 50 along the thickness direction of the electric connector 10 is longer, even when the electric connector 10 is compressed in the thickness direction so as to be connected to the object to be measured, a stable resistance value is obtained with a low load, and the connection terminals of the object to be measured can be prevented from being damaged.

When the hollow body 50 is formed on the connection terminal side of the first device and the connection terminal side of the second device, respectively, it is more preferred that a ratio between the length of the hollow body 50 on the connection terminal side of the first device and the length of the hollow body 50 on the connection terminal side of the second device be 1:1. In addition, from the viewpoint of corrosion resistance of the conductive member 30, it is more preferred that the conductive member 30 be the hollow body 50 over the entire length as illustrated in FIG. 1C.

It is not always required that the hollow body 50 be a completely tubular member. The shape of a cross section perpendicular to a longitudinal direction of the hollow body 50 is not particularly limited, and may be, for example, a shape in which a hole is opened in a part of a tube, such as a C-shape or a crescent shape. In addition, the hollow body 50 may have a shape in which a part of the through hole 21 is exposed to at least one of the one principal surface 20a and the another principal surface 20b of the elastic body 20.

The conductive member 30 is joined to the through hole 21 of the elastic body 20. With this, the conductive member 30 is arranged so as to penetrate through the elastic body 20 perpendicularly or obliquely to the thickness direction thereof.

In addition, it is preferred that an end portion 30a or an end portion 30b of the conductive member 30 protrude from at least one of the one principal surface 20a and the another principal surface 20b of the elastic body 20. The term "end portion" as used herein means a range from the distal end of the conductive member to a quarter of the entire length of the conductive member. It is more preferred that the one end portion 30a of the conductive member 30 protrude from the one principal surface 20a of the elastic body 20, and the another end portion 30b of the conductive member 30 protrude from the another principal surface 20b of the elastic body 20. It is only required that, under a state in which the conductive member 30 is joined to the through hole 21, an outermost surface (end surface) of the one end portion 30a be at least in flush with the one principal surface 20a of the elastic body 20, and an outermost surface (end surface) of the another end portion 30b be at least in flush with the another principal surface 20b of the elastic body 20.

The protrusion amounts of the one end portion 30a and the another end portion 30b of the conductive member 30 from the elastic body 20 are not particularly limited, and are appropriately adjusted in accordance with the shapes and arrangement of the connection terminals of the two devices to be electrically connected by the electric connector 10, and the like.

The interval between adjacent two conductive members 30, that is, the center-to-center distance (pitch) between the adjacent two conductive members 30 is not particularly limited, and is appropriately adjusted in accordance with the arrangement of the connection terminals of the two devices to be electrically connected by the electric connector 10, and the like. It is preferred that a center-to-center distance between the adjacent two conductive members 30 ($P_1$ and $P_2$ in FIG. 1B) be from 6 µm to 1,000 µm. The center-to-center distance between the adjacent two conductive members 30 corresponds to a center-to-center distance between the adjacent two through holes 21.

The shape of the conductive member 30, that is, the shape of a cross section perpendicular to the longitudinal direction of the conductive member 30 is not particularly limited, and there are given, for example, a circular shape, an elliptic shape, a triangular shape, a square shape, a rectangular shape, and polygonal shapes of a pentagonal shape or more.

The diameter (outer diameter) of the conductive member 30 is not particularly limited, but is preferably from 5 µm to 300 µm. When the shape of the conductive member 30 is a shape other than a circular shape, the diameter of the conductive member 30 is defined as a length of a portion having the largest width of an outer edge in the cross section perpendicular to the longitudinal direction of the conductive member 30.

An inner diameter of the conductive member 30 is preferably from 0.1 µm to 260 µm, more preferably from 1 µm to 30 µm.

The outer diameter herein is a value obtained by measuring outer diameters at five positions with magnifying observation means such as a microscope and averaging the outer diameters. In addition, the inner diameter herein is a value obtained by measuring inner diameters at five positions with magnifying observation means such as a microscope and averaging the inner diameters.

The thickness of the conductive member 30 is preferably from 0.05 µm to 25 µm, more preferably from 0.1 µm to 20 µm, still more preferably from 0.5 µm to 15 µm, particularly preferably from 1 µm to 5 µm.

The thickness of the conductive member is a value obtained by measuring thicknesses at five positions with magnifying observation means such as a microscope and averaging the thicknesses.

A material of the elastic body 20 is not particularly limited as long as the material has elasticity when formed into the elastic body 20. Examples of such material include synthetic rubbers, such as an acrylonitrile-butadiene rubber, a silicone rubber, a chloroprene rubber, an ethylene-chloroprene rubber, an ethylene-propylene-diene rubber, a styrene-butadiene rubber, a fluorine rubber, a butadiene rubber, an isoprene rubber, and a urethane rubber. Of those, a silicone rubber is preferred from the viewpoint that the silicone rubber has high elasticity and is excellent in heat resistance.

There is no particular limitation on the core member, as long as a metal layer can be formed on an outer peripheral surface of the core member by electrolytic plating, electroless plating, or vapor deposition, and the metal layer can be easily removed by a method described later. As a material for the core member, there are given, for example, a base metal such as iron, copper, aluminum, lead, zinc, tin, or tungsten that can be easily removed by wet etching through use of nitric acid. As a material for the core member, there is also given, for example, a resin such as polyvinyl alcohol that is dissolvable in water or an organic solvent and can be easily removed.

The shape of the core member, that is, the shape of a cross section perpendicular to the longitudinal direction of the core member is not particularly limited, and there are given, for example, a circular shape, an elliptic shape, a triangular shape, a square shape, a rectangular shape, and polygonal shapes of a pentagonal shape or more.

The diameter (outer diameter) of the core member is not particularly limited, but is preferably from 5 µm to 260 µm. When the shape of the core member is a shape other than a circular shape, the diameter of the core member is defined as a length of a portion having the largest width of an outer edge in the cross section perpendicular to the longitudinal direction of the core member.

There is no particular limitation on a material for the metal layer of the conductive member 30 as long as the metal layer can be formed by electrolytic plating or electroless plating and is not corroded by wet etching through use of nitric acid or with water, an acid, an alkali, and an organic solvent. An example of the material for the metal layer is a noble metal. Examples of the noble metal include metals, such as gold, platinum, silver, copper, nickel, rhodium, palladium, and black ruthenium, and alloys of these metals. Of those, gold, platinum, silver, and copper, which each have a high standard electrode potential, are more preferred, and gold and silver, which each have a low hardness, are still more preferred. The same materials or a plurality of materials may be laminated on each other in the metal layer.

When the metal layer is formed of two or more layers, materials for the respective layers may be the same or different.

There is no particular limitation on the thickness of the metal layer as long as the hollow body 50 formed of only the metal layer can be formed at least under a state in which the core member is removed. For example, when the electric connector 10 is used for connecting devices for a high-frequency current to each other, the thickness of the metal layer is preferably from 0.01 µm to 25 µm, more preferably from 0.1 µm to 20 µm, still more preferably from 1 µm to 20 µm, particularly preferably from 1 µm to 5 µm. When the thickness of the metal layer is equal to or more than a lower limit value of the above-mentioned range, connection stability is improved. When the thickness of the metal layer is equal to or less than an upper limit value of the above-mentioned range, the separation distance and pitch between the adjacent conductive members can be reduced. The thickness of the metal layer is a value obtained by measuring thicknesses at five positions with magnifying observation means such as a microscope and averaging the thicknesses.

In addition, when the metal layer is formed of two or more layers, thicknesses of the respective layers are not particularly limited. In this case, it is preferred that the thickness of the entire metal layer fall within the above-mentioned range.

The electric connector 10 according to this embodiment includes the composite 40 including: the elastic body 20 having a plurality of through holes 21 in the thickness direction; and the conductive members 30, which are joined to the through holes 21, and are configured to electrically connect connection terminals of two devices to each other. In each of the conductive members 30, at least a part of the vicinity of at least one of distal ends on connection terminal sides of the two devices is the hollow body 50. Therefore, the composite 40 including the elastic body 20 and the conductive members 30 are deformed (warped) in the thickness direction of the elastic body 20 with a smaller force. With this, when the connection terminals of the device to be connected to the electric connector 10 and the conductive members 30 are connected to each other, an excessive force is not applied to the connection terminals of the device from the conductive members 30 so that the connection terminals can be prevented from being damaged, and the conductive members 30 can be stably connected to the connection terminals of the device.

[Method of Manufacturing Electric Connector]

A method of manufacturing an electric connector according to this embodiment includes: a step (hereinafter referred to as "step A") of arranging a plurality of composite members each including a core member and a conductive member, which has at least one metal layer made of a noble metal formed on an outer peripheral surface of the core member, on a first resin layer formed of an elastic body in parallel to each other at suitable intervals with the plurality of composite members being aligned with each other in the same direction, forming a second resin layer formed of an elastic body on the first resin layer, integrating the second resin layer with the first resin layer, and fixing the plurality of composite members between the first resin layer and the second resin layer, to thereby form a conductive member-containing sheet; a step (hereinafter referred to as "step B") of laminating a plurality of conductive member-containing sheets on one another with the plurality of composite members being aligned with each other in the same direction, to thereby form a laminate of the conductive member-containing sheets; a step (hereinafter referred to as "step C") of cutting the laminate in a perpendicular direction with respect to an extending direction of the plurality of composite members, to thereby obtain a precursor sheet formed of the elastic body having through holes each having the conductive member, which has been cut into a round slice, joined thereto; and a step (hereinafter referred to as "step D") of removing at least a part of the core member to bring at least a part of a vicinity of at least one of distal ends on a cut surface side of the precursor sheet and a surface side on an opposite side of the cut surface in the conductive member into a hollow state, to thereby obtain an electric connector. The step A includes a step A-1 and a step A-2 described later.

Now, the method of manufacturing an electric connector according to this embodiment is described with reference to FIGS. 2A to 2D.

FIGS. 2A to 2D are perspective views for illustrating an overview of the method of manufacturing an electric connector according to this embodiment. In FIGS. 2A to 2D, the same configurations as those of the electric connector according to this embodiment illustrated in FIGS. 1A to 1C are denoted by the same reference symbols as those therein, and overlapping description of the same configurations is omitted.

Figure 2A:
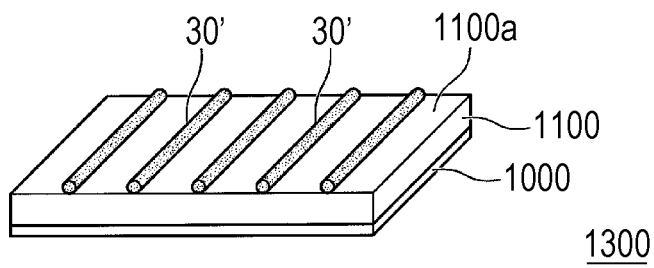
FIGS. 2A to 2D are perspective views for illustrating an overview of a method of manufacturing the electric connector according to the first embodiment.

As illustrated in FIG. 2A, the plurality of composite members 30' each including the core member and the conductive member 30 are arranged on a first surface 1100a of a first resin layer 1100 formed on a base material 1000 in parallel to each other at suitable intervals with the composite members 30' being aligned with each other in the same direction (step A-1).

In this case, as illustrated in FIG. 2A, the plurality of composite members 30' are arranged so as to extend in a direction perpendicular to a longitudinal direction of the base material 1000.

The term "first surface" as used herein means a surface having the largest area.

The term "suitable intervals" as used herein means that the center-to-center distance between the adjacent two conductive members 30 is preferably from 6 µm to 1,000 µm.

As the base material 1000, a base material, which can be easily peeled from a conductive member-containing sheet after the conductive member-containing sheet is formed, is used. As a material for the base material 1000, there is given, for example, polyethylene terephthalate (PET).

As a material for the first resin layer 1100, there is given the same material as that for the elastic body 20.

As a method of forming the first resin layer 1100 on the base material 1000, there is given, for example, a method involving bonding a sheet-shaped or film-shaped member made of the above-mentioned material to the base material 1000 or applying a liquid or paste material made of the above-mentioned material onto the base material 1000, and curing the material by heating, humidification, light irradiation, or the like to form a coating film. When the sheet-shaped or film-shaped member is bonded to the base material 1000, an adhesive may be used, or the member may be activated by surface treatment so as to be chemically bound to the base material 1000.

The thickness of the first resin layer 1100 is not particularly limited, but is preferably from 2 µm to 500 µm.

Figure 2B:
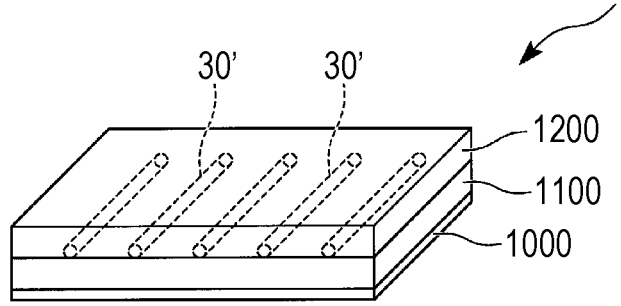

Then, as illustrated in FIG. 2B, a second resin layer 1200 is formed on the first surface 1100a of the first resin layer 1100 on which the plurality of composite members 30' are arranged. The second resin layer 1200 is integrated with the first resin layer 1100, and the composite members 30' are fixed between the first resin layer 1100 and the second resin layer 1200, to thereby form a conductive member-containing sheet 1300 (step A-2).

As a material for the second resin layer 1200, there is given the same material as that for the first resin layer 1100.

As a method of forming the second resin layer 1200 on the first surface of the first resin layer 1100, there is given the same method as that of forming the first resin layer 1100 on the base material 1000.

The thickness of the second resin layer 1200 is not particularly limited, but is preferably from 2 µm to 500 µm.

Figure 2C:
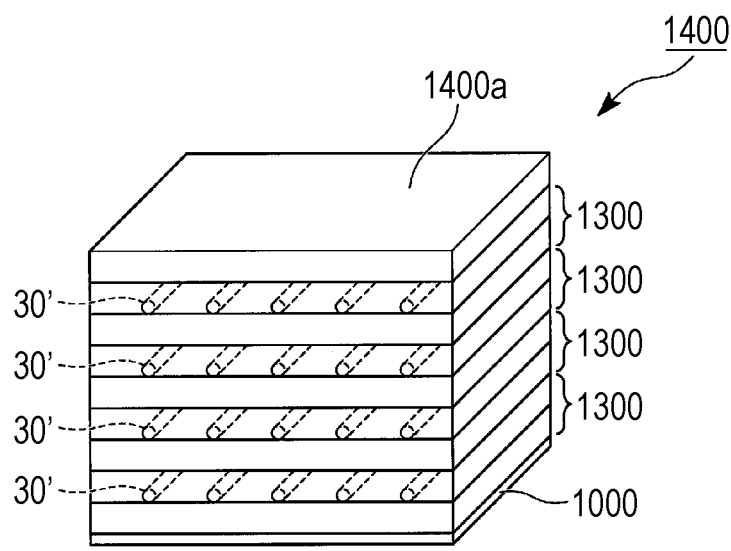

Then, as illustrated in FIG. 2C, a plurality of conductive member-containing sheets 1300 are laminated on one another with the composite members 30' being aligned with each other in the same direction, to thereby form a laminate 1400 of the conductive member-containing sheets 1300 (step B).

In the step B, it is preferred that the plurality of conductive member-containing sheets 1300 be laminated also with the composite members 30' being aligned in arrangement in addition to the alignment of the composite members 30' in the same direction.

In the step B, aligning the composite members 30' in arrangement means that, when the laminate 1400 is viewed from a principal surface 1400a thereof, the composite members 30' included in each of the plurality of conductive member-containing sheets 1300 are overlapped with each other. In FIG. 2C, there is illustrated the case in which all the composite members 30' are overlapped with each other, but a part of the composite members 30' may not be overlapped with each other.

In the step B, when the conductive member-containing sheets 1300 are laminated in a thickness direction thereof, the base materials 1000 are peeled from the conductive member-containing sheets 1300, respectively, except for the conductive member-containing sheet 1300 forming a lowermost layer.

In order to laminate the conductive member-containing sheets 1300, an adhesive may be used, or the conductive member-containing sheets 1300 may be activated by surface treatment so as to be chemically bound to each other.

When the adhesive is used, an adhesive made of the same material as that for the first resin layer 1100 may be used, or an adhesive made of a material different from that for the first resin layer 1100 may be used.

Figure 2D:
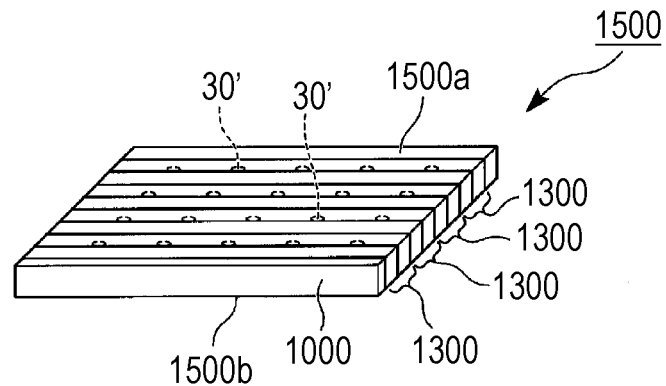

Then, as illustrated in FIG. 2D, the laminate 1400 is cut to a predetermined thickness in a direction perpendicular to the extending direction of the composite members 30', to thereby obtain a precursor sheet 1500 formed of the elastic body having the through holes 21 each having the conductive member 30, which has been cut into a round slice, joined thereto (step C).

In the step C, as a method of cutting the laminate 1400, for example, laser processing, mechanical processing such as cutting, or the like is used.

Then, the core member of each of the composite members 30' in the through holes 21 is removed to bring at least a part of a vicinity of at least one of distal ends on a cut surface (one principal surface) 1500a side of the precursor sheet 1500 and a surface (another principal surface) 1500b side on an opposite side of the cut surface 1500a in the composite member 30' into a hollow state, to thereby form a hollow body 50. Thus, the electric connector 10 illustrated in FIGS. 1A to 1C is obtained (step D).

In the step D, the core member of the composite member 30' is dissolved through use of a solution to be removed from the composite member 30'. Specifically, when the core member is made of a base metal such as iron, copper, aluminum, lead, zinc, tin, or tungsten, the core member is removed by wet etching through use of nitric acid. Specifically, the precursor sheet 1500 is immersed in an etchant containing nitric acid, and the core member is corroded and dissolved with the etchant to be removed from the composite member 30'. When the core member is made of a resin such as polyvinyl alcohol, the precursor sheet 1500 is immersed in water or an organic solvent, and the core member is dissolved in the water or the organic solvent to be removed from the composite member 30'.

The temperature given when the precursor sheet 1500 is immersed in the solution is preferably from 10° C. to 50° C.

After the steps A to D, the base material 1000 is peeled from the laminate 1400 to obtain the electric connector 10 illustrated in FIGS. 1A to 1C.

The thickness of the electric connector 10 is preferably from 50 μm to 1 mm, more preferably from 70 μm to 500 μm, still more preferably from 100 μm to 250 μm.

In this embodiment, there is illustrated the case in which the laminate 1400 is cut in the direction perpendicular to the extending direction of the composite members 30', but this disclosure is not limited thereto. In this disclosure, in the step C, the laminate may be cut in a direction oblique to the extending direction of the conductive members.

In the method of manufacturing an electric connector according to this embodiment, the electric connector 10, which enables stable connection to the connection terminals of the device to be connected to the electric connector 10 without application of an excessive force to the connection terminals of the device from the conductive members 30, is obtained.

In addition, the method of manufacturing an electric connector according to this embodiment may include, after the step C of obtaining a precursor sheet and before the step D of removing the core member, a step E of causing the conductive members 30 included in the precursor sheet 1500 to protrude from at least one of the one principal surface 1500a and the another principal surface 1500b of the precursor sheet 1500.

As a method of causing the conductive members 30 to protrude from at least one of the one principal surface 1500a and the another principal surface 1500b of the precursor sheet 1500 in the step E, for example, a method involving cutting a part of the elastic body from at least one of the one principal surface 1500a and the another principal surface 1500b of the precursor sheet 1500 by laser etching, chemical etching, or mechanical processing such as cutting is used.

Second Embodiment

[Electric Connector]

Figure 3:
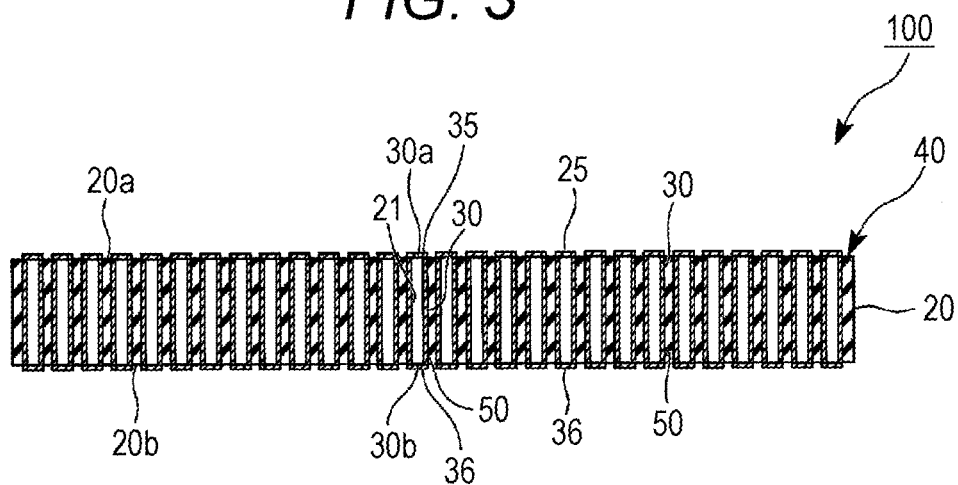
FIG. 3 is a sectional view for illustrating a schematic configuration of an electric connector according to a second embodiment.

FIG. 3 is a sectional view for illustrating a schematic configuration of an electric connector according to this embodiment. In FIG. 3, the same configurations as those of the electric connector according to the first embodiment illustrated in FIGS. 1A to 1C are denoted by the same reference symbols as those therein, and overlapping description of the same configurations is omitted.

As illustrated in FIG. 3, an electric connector 100 according to this embodiment includes a composite 40 including an elastic body 20 and conductive members 30.

In the electric connector 100 according to this embodiment, under a state in which the conductive member 30 is joined to a through hole 21, one end portion 30a protrudes from one principal surface 20a of the elastic body 20, and another end portion 30b protrudes from another principal surface 20b of the elastic body 20. Further, the one end portion 30a and the another end portion 30b of the conductive member 30 are subjected to plating to form a plated layer 35 and a plated layer 36 on the one end portion 30a and the another end portion 30b, respectively.

Materials for the plated layers 35 and 36 are not particularly limited, and are appropriately selected in accordance with the material for the conductive members 30.

In the electric connector 100 according to this embodiment, the plated layer 35 is formed on the one end portion 30a of the conductive member 30, and the plated layer 36 is formed on the another end portion 30b of the conductive member 30. Therefore, each surface area (sectional area) of both ends (one end portion 30a and another end portion 30b) of the conductive member 30 is increased owing to the plated layers 35 and 36, and the contact areas between both the ends (one end portion 30a and another end portion 30b) of the conductive member 30 and the connection terminals of two devices is secured, with the result that the electrical connection state therebetween can be stably kept.

In this embodiment, there is illustrated the following case. Under a state in which the conductive member 30 is joined to the through hole 21, the one end portion 30a protrudes from the one principal surface 20a of the elastic body 20, and the another end portion 30b protrudes from the another principal surface 20b of the elastic body 20. Further, the one end portion 30a and the another end portion 30b of the conductive member 30 are subjected to plating to form the plated layer 35 and the plated layer 36 on the one end portion 30a and the another end portion 30b, respectively. However, this disclosure is not limited thereto. In this disclosure, it is only required that the conductive member 30 be joined to the through hole 21 in a state of protruding from at least one of the one principal surface 20a and the another principal surface 20b of the elastic body 20. In addition, it is only required that, in the conductive member 30, the plated layers 35 and 36 be formed on the end portions 30a and 30b protruding from at least one of the one principal surface 20a and the another principal surface 20b of the elastic body 20.

[Method of Manufacturing Electric Connector]

A method of manufacturing an electric connector according to this embodiment includes: a step (step A) of forming the above-mentioned conductive member-containing sheet; a step (step B) of forming a laminate of the conductive member-containing sheets; a step (step C) of cutting the laminate to obtain a precursor sheet; a step (hereinafter referred to as "step E") of causing the conductive member included in the precursor sheet to protrude from at least one of a cut surface of the precursor sheet and a surface on an opposite side of the cut surface; a step (step D) of obtaining the above-mentioned electric connector; and a step (hereinafter referred to as "step F") of subjecting the end portion of the conductive member on at least one of the one principal surface and the another principal surface of the electric connector to plating.

Now, the method of manufacturing an electric connector according to this embodiment is described with reference to FIGS. 2A to 2D and FIG. 3.

In the method of manufacturing an electric connector according to this embodiment, the steps A to E are performed to obtain the electric connector 10 in which both the end portions 30a and 30b of the conductive member 30 protrude from the one principal surface 20a and the another principal surface 20b of the elastic body 20, respectively, in the same manner as in the method of manufacturing an electric connector according to the first embodiment.

Then, the end portion 30a of the conductive member 30 on the one principal surface 10a of the electric connector 10 and the end portion 30b of the conductive member 30 on the another principal surface 10b of the electric connector 10 are subjected to plating to form the plated layer 35 and the plated layer 36 on the one end portion 30a and the another end portion 30b of the conductive member 30, respectively (step F).

In the step F, as a plating method, for example, electrolytic plating or electroless plating is used.

The thickness of the plated layer 35 is preferably from 0.05 μm to 25 μm, more preferably from 0.1 μm to 20 μm, still more preferably from 0.5 μm to 15 μm, particularly preferably from 1 μm to 5 μm.

It is preferred that the plated layer be formed so as to close an opening of the hollow body 50 as illustrated in FIG. 3.

Through the steps A to F, the electric connector 100 illustrated in FIG. 3 is obtained.

In the method of manufacturing an electric connector according to this embodiment, the one end portion 30a and the another end portion 30b of the conductive member 30 are subjected to plating in the step F. Therefore, each surface area (sectional area) of both ends (one end portion 30a and another end portion 30b) of the conductive member 30 is increased owing to the plated layers 35 and 36, and the contact areas between both the ends (one end portion 30a and another end portion 30b) of the conductive member 30 and the connection terminals of two devices is secured, with the result that the electric connector 100 capable of stably keeping the electrical connection state therebetween is obtained.

In this embodiment, there is illustrated the following case. The one end portion 30a of the conductive member 30 is caused to protrude from the one principal surface 20a of the elastic body 20, and the another end portion 30b of the conductive member 30 is caused to protrude from the another principal surface 20b of the elastic body 20. Further, the one end portion 30a and the another end portion 30b of the conductive member 30 are subjected to plating to form the plated layer 35 and the plated layer 36 on the one end portion 30a and the another end portion 30b, respectively. However, this disclosure is not limited thereto. In this disclosure, it is only required that the conductive member 30 be caused to protrude from at least one of the one principal surface 20a and the another principal surface 20b of the elastic body 20, and that the plated layers 35 and 36 be formed on the end portions 30a and 30b protruding from at least one of the one principal surface 20a and the another principal surface 20b of the elastic body 20.

Third Embodiment

[Electric Connector]

Figure 4:
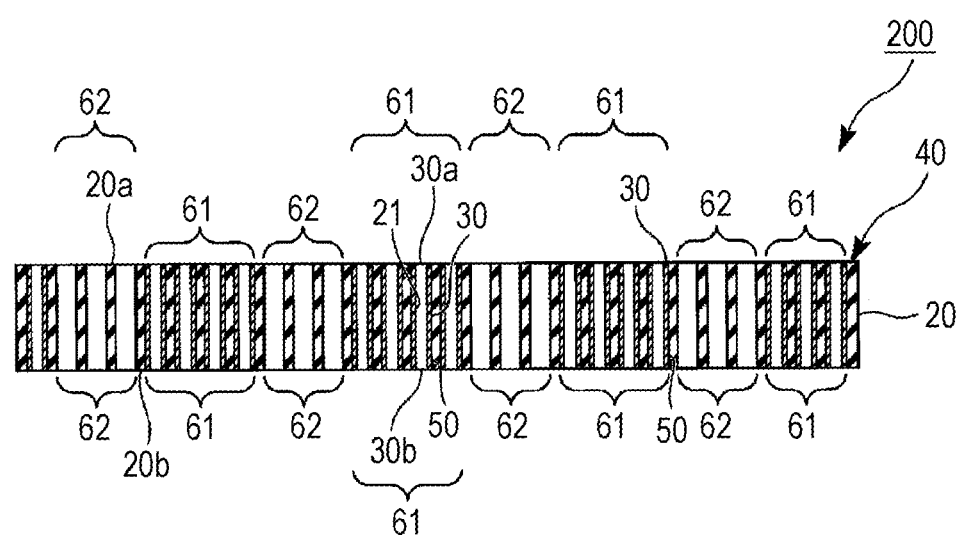
FIG. 4 is a sectional view for illustrating a schematic configuration of an electric connector according to a third embodiment.

FIG. 4 is a sectional view for illustrating a schematic configuration of an electric connector according to this embodiment. In FIG. 4, the same configurations as those of the electric connector according to the first embodiment illustrated in FIGS. 1A to 1C are denoted by the same reference symbols as those therein, and overlapping description of the same configurations is omitted.

As illustrated in FIG. 4, an electric connector 200 according to this embodiment includes a composite 40 including an elastic body 20 and conductive members 30.

The electric connector 200 according to this embodiment includes a plurality of conductive regions 61 and non-conductive regions 62 on one principal surface 20a and another principal surface 20b of the elastic body 20. Each of the conductive regions 61 has through holes 21, each of the through holes 21 having the conductive member 30 joined thereto. Each of the non-conductive regions 62 is formed between the plurality of conductive regions 61, and has the through holes 21, each of the through holes 21 being free of the conductive member 30.

The positions at which the conductive regions 61 are provided are not particularly limited, and are appropriately adjusted in accordance with the arrangement of the connection terminals of two devices to be electrically connected by the electric connector 200 (specifically conductive members 30 joined to the through holes 21), and the like.

The size of the conductive region 61, that is, the area of the conductive region 61 given when the elastic body 20 is viewed in plan view from the one principal surface 20a is not particularly limited, and is appropriately adjusted in accordance with the sizes of the connection terminals of the two devices to be electrically connected to each other by the electric connector 200 (specifically the conductive members 30 joined to the through holes 21), and the like. The area of each of the conductive regions 61 in plan view can be set to, for example, within a range of from 50% by area to 150% by area with respect to the area of one connection terminal of the device in plan view.

The shape of the conductive region 61, that is, the shape of the conductive region 61 given when the elastic body 20 is viewed in plan view from the one principal surface 20a is not particularly limited, and is appropriately adjusted in accordance with the shapes of the connection terminals of the two devices to be electrically connected to each other by the electric connector 10 (specifically the conductive members 30 joined to the through holes 21), and the like. As the shape of the conductive region 61 given when the conductive region 61 is viewed in plan view, there are given, for example, a circular shape, an elliptic shape, a triangular shape, a square shape, and a rectangular shape.

The positions at which the conductive members 30 included in the conductive region 61 are provided, that is, the arrangement of the through holes 21 in the conductive region 61 are not particularly limited, and are appropriately adjusted in accordance with the arrangement of the connection terminals of the two devices to be electrically connected to each other by the electric connector 200 (specifically the conductive members 30 joined to the through holes 21), and the like. In order to cause the conductive region 61 to be uniformly deformed (warped), it is preferred that the conductive members 30 (through holes 21) be formed at equal intervals in the conductive region 61.

The number of the conductive members 30 included in the conductive region 61, that is, the number of the through holes 21 included in the conductive region 61 is not particularly limited, and is appropriately adjusted in accordance with the arrangement of the connection terminals of the two devices to be electrically connected to each other by the electric connector 200 (specifically the conductive members 30 joined to the through holes 21), required pressing force of the conductive members 30 applied to the connection terminals, and the like.

The positions at which the non-conductive regions 62 are provided are not particularly limited as long as each of the non-conductive regions 62 is arranged between the plurality of conductive regions 61.

The non-conductive region 62 is arranged, for example, within a range to which a stress of the conductive regions 61 is applied when the electric connector 200 is deformed.

The size of the non-conductive region 62, that is, the area of the non-conductive region 62 given when the elastic body 20 is viewed in plan view from the one principal surface 20a is not particularly limited, and is appropriately adjusted in accordance with the elasticity and flexibility required in the non-conductive region 62, and the like.

The shape of the non-conductive region 62, that is, the shape of the non-conductive region 62 given when the elastic body 20 is viewed in plan view from the one principal surface 20a is not particularly limited, and is appropriately adjusted in accordance with the shapes of the connection terminals of the two devices to be electrically connected to each other by the electric connector 200 (specifically the conductive members 30 joined to the through holes 21), and the like.

The arrangement of the through holes 21 in the non-conductive region 62 is not particularly limited, and is appropriately adjusted in accordance with the elasticity and flexibility required in the non-conductive region 62, and the like. It is only required that the through holes 21 in the non-conductive region 62 be arranged, for example, within a range to which a stress of the conductive regions 61 is applied when the electric connector 200 is deformed, and the conductive members 30 may be present in the other range. In order to cause the non-conductive region 62 to be uniformly deformed (warped), it is preferred that the through holes 21 be arranged at equal intervals in the non-conductive region 62.

The number of the through holes 21 in the non-conductive region 62 is not particularly limited, and is appropriately adjusted in accordance with the elasticity and flexibility required in the non-conductive region 62, and the like.

The electric connector 200 according to this embodiment includes the plurality of conductive regions 61 and the non-conductive regions 62 on the one principal surface 20a and the another principal surface 20b of the elastic body 20. Each of the conductive regions 61 has the through holes 21, each of the through holes 21 having the conductive member 30 joined thereto. Each of the non-conductive regions 62 is formed between the plurality of conductive regions 61, and has the through holes 21, each of the through holes 21 being free of the conductive member 30. Therefore, the conductive regions 61 and the non-conductive region 62 in the vicinity of the conductive regions 61 are deformed (warped) in the thickness direction of the elastic body 20 with a smaller force. With this, when the connection terminals of the devices and the conductive members 30 in the conductive regions 61 are connected to each other, an excessive force is not applied to the connection terminals from the conductive members 30, and the connection terminals can be prevented from being damaged. In the electric connector 200 according to this embodiment, the non-conductive regions 62 each having the hollow through holes 21 are more likely to be deformed (warped) in the thickness direction of the elastic body 20. As a result, the entire electric connector 200 can be deformed (warped) in the thickness direction thereof with a smaller force.

In this embodiment, there is illustrated the case in which the electric connector 200 includes the plurality of conductive regions 61 and the non-conductive regions 62 each formed between the plurality of conductive regions 61. However, this disclosure is not limited thereto. In this disclosure, all of regions other than the conductive regions 61 may be the non-conductive regions 62.

Further, also in this embodiment, the conductive member 30 may be joined to the through hole 21 in a state of protruding from at least one of the one principal surface 20a and the another principal surface 20b of the elastic body 20. In addition, in the conductive member 30, the plated layers 35 and 36 may be formed on the end portions 30a and 30b protruding from at least one of the one principal surface 20a and the another principal surface 20b of the elastic body 20.

[Method of Manufacturing Electric Connector]

A method of manufacturing an electric connector according to this embodiment includes: a step (step A) of forming the above-mentioned conductive member-containing sheet; a step (step B) of forming a laminate of the conductive member-containing sheets; a step (step C) of cutting the laminate to obtain a precursor sheet; a step (step D) of obtaining the above-mentioned electric connector; a step (hereinafter referred to as "step G") of forming masking layers on one principal surface and another principal surface of the electric connector, respectively; a step (hereinafter referred to as "step H") of removing parts of the masking layer on the one principal surface of the electric connector; a step (hereinafter referred to as "step I") of removing conductive members in portions obtained by removing the masking layer in the electric connector, to thereby form, in the electric connector, non-conductive regions each having through holes, each of the through holes being free of the conductive members, on the one principal surface and the another principal surface of the electric connector; and a step (hereinafter referred to as "step J") of removing remaining portions of the masking layer to form, in the electric connector, a plurality of conductive regions each having the through holes, each of the through holes having the conductive member joined thereto, with the non-conductive region interposed between the plurality of conductive regions, on the one principal surface and the another principal surface of the electric connector.

Now, the method of manufacturing an electric connector according to this embodiment is described with reference to FIGS. 2A to 2D, FIG. 4, and FIGS. 5A to 5D.

In the method of manufacturing an electric connector according to this embodiment, the steps A to D are performed to obtain the electric connector 10, in the same manner as in the method of manufacturing an electric connector according to the first embodiment.

Figure 5A:
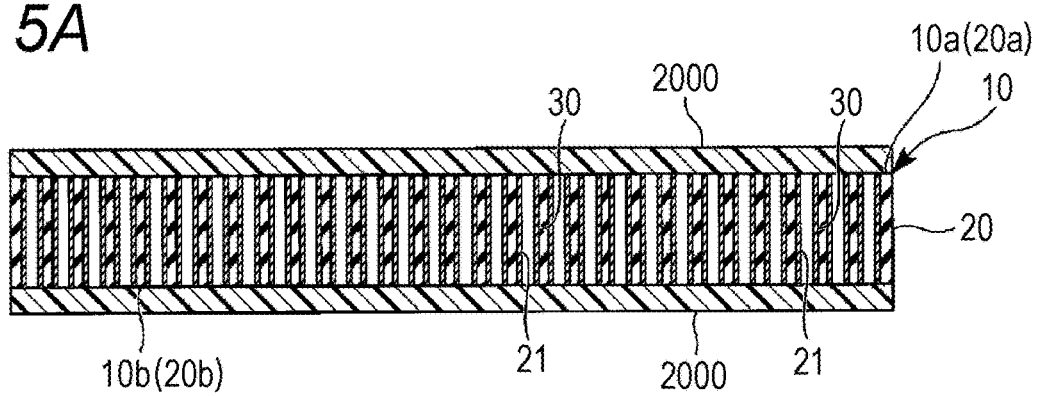
FIGS. 5A to 5D are sectional views for illustrating an overview of a method of manufacturing the electric connector according to the third embodiment.

Then, as illustrated in FIG. 5A, masking layers 2000 are formed on the one principal surface 10a and the another principal surface 10b of the electric connector 10, respectively (step G).

The one principal surface 10a of the electric connector 10 corresponds to the one principal surface 20a of the elastic body 20, and the another principal surface 10b of the electric connector 10 corresponds to the another principal surface 20b of the elastic body 20.

In the step B, as a method of forming the masking layer 2000, for example, a method involving bonding a film-shaped or sheet-shaped resin member to the principal surface or a method involving laminating a coating material on the principal surface is used.

As a method of bonding the resin member to the principal surface, there are given, for example, a method involving bonding a resin member to the one principal surface 10a and the another principal surface 10b of the electric connector 10 through a pressure-sensitive adhesive, to thereby form the masking layers 2000 made of the resin member, a method involving bonding a member made of silicone to the one principal surface 10a and the another principal surface 10b of the electric connector 10, to thereby form the masking layers 2000 made of silicone, and a method involving bonding a dry film resist to the one principal surface 10a and the another principal surface 10b of the electric connector 10, to thereby form the masking layers 2000 made of the dry film resist.

As a method of laminating a coating material on the principal surface, there is given, for example, a method involving applying, as a coating material, an acrylic resin, an epoxy-based resin, an ester-based resin, a urethane-based resin, an imide-based resin, or the like, which is in an uncured state or a semi-cured state, onto the one principal surface 10a and the another principal surface 10b of the electric connector 10 by screen printing or a general coating method, and curing the coating material to form a coating film, to thereby form the masking layers 200 made of the coating film.

In the step G, when the masking layer 2000 having a shape corresponding to the conductive region 61 is formed on the one principal surface 10a of the electric connector 10 by screen printing, the step H described later can be omitted.

Figure 5B:
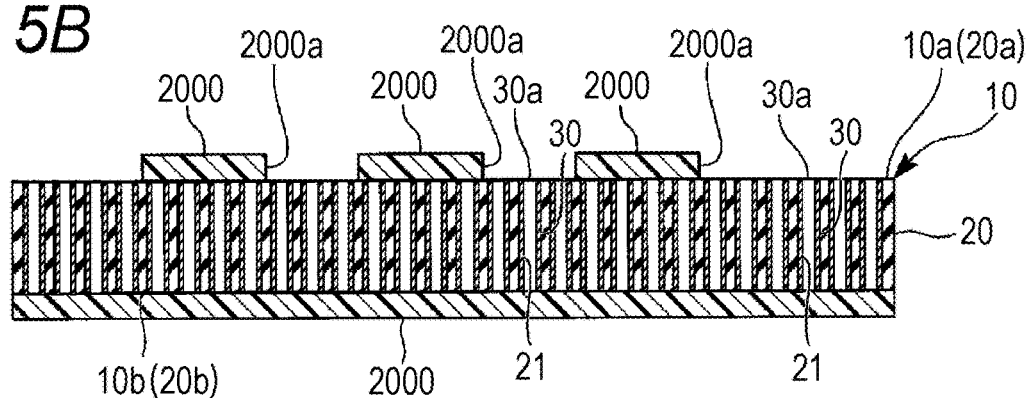

Then, as illustrated in FIG. 5B, parts of the masking layer 2000 are removed on the one principal surface 10a of the electric connector 10 (step H).

With this, in portions obtained by removing the masking layer 2000 (openings 2000a of the masking layer 2000), the one end portion 30a of each of the conductive members 30 is exposed to the one principal surface 10a of the electric connector 10.

As a method of removing the masking layer 2000, there is given, for example, laser etching. In addition, when an uncured resin or a dry film resist is used for forming the masking layer 2000, there is given a method involving partially irradiating the uncured resin or the dry film resist with UV-rays or an electron beam to partially cure the uncured resin or the dry film resist and removing uncured portions by washing.

Figure 5C:
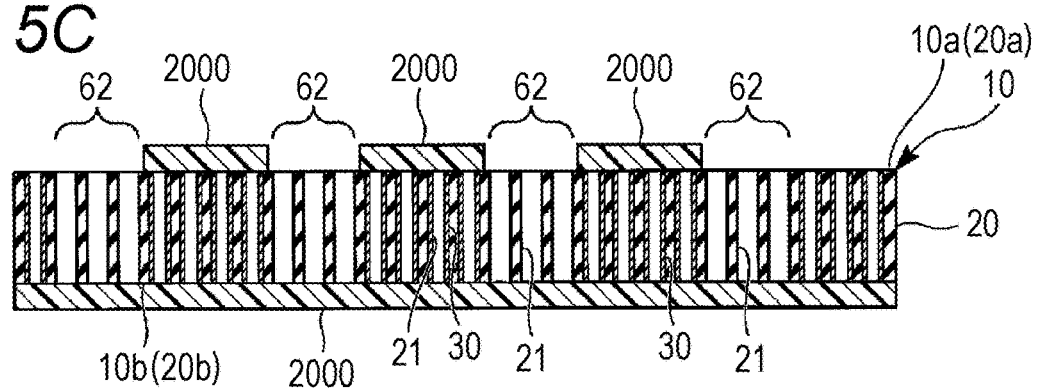

Then, as illustrated in FIG. 5C, in each of the portions obtained by removing the masking layer 2000 in the electric connector 10, the conductive members 30 are removed, to thereby form, in the electric connector 10, the non-conductive region 62 having the through holes 21, each of the through holes 21 being free of the conductive member 30, on the one principal surface 10a and the another principal surface 10b of the electric connector 10 (step I). When the masking layers 2000 each having a shape corresponding to the conductive region 61 are formed in the step G, the conductive members 30 are removed in each portion in which the masking layer 2000 is not formed in the electric connector 10, to thereby form, in the electric connector 10, the non-conductive regions 62 each having the through holes 21, each of the through holes 21 being free of the conductive member 30, on the one principal surface 10a and the another principal surface 10b in the step I.

In the step I, as a method of removing the conductive members 30, for example, wet etching is used.

An etchant to be used in wet etching is not particularly limited, and is appropriately selected in accordance with the material for the conductive members 30.

Figure 5D:
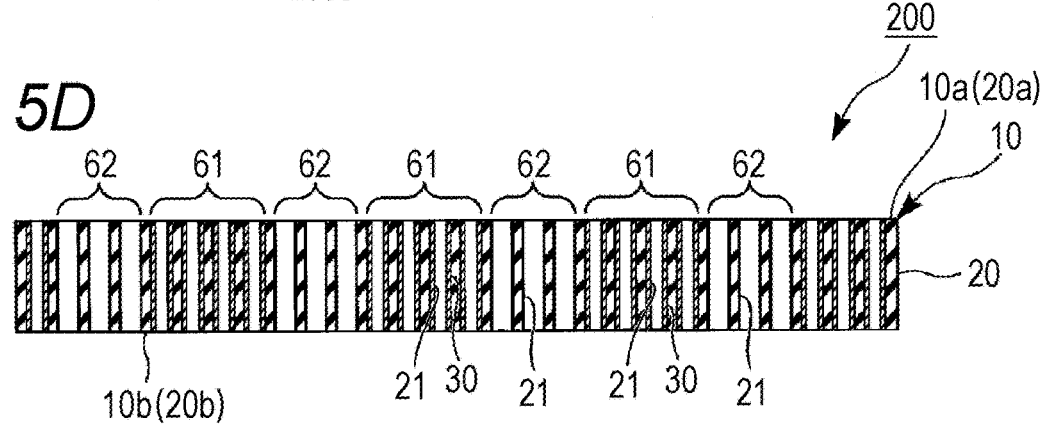

Then, as illustrated in FIG. 5D, remaining portions of the masking layers 2000 in the electric connector 10 are removed to form, in the electric connector 10, the plurality of conductive regions 61 each having the through holes 21, each of the through holes 21 having the conductive member 30 joined thereto, with the non-conductive region 62 interposed between the plurality of conductive regions 61, on the one principal surface 10a and the another principal surface 10b of the electric connector 10 (step J).

In the step J, as a method of removing the masking layer 2000, for example, laser etching, mechanical processing such as cutting, or a peeling method using a peeling liquid is used.

Through the steps A to J, the electric connector 200 illustrated in FIG. 4 is obtained.

In the method of manufacturing an electric connector according to this embodiment, the masking layers 2000 are formed in the step G, and parts of the masking layer 2000 are removed in the step H. In each of the portions obtained by removing the masking layer 2000, the conductive members 30 are removed to form the non-conductive region 62 in the step I. The remaining portions of the masking layers 2000 are removed to form the conductive regions 61 in the step J. Therefore, the electric connector 200, in which the conductive regions 61 and the non-conductive regions 62 in the vicinity of the conductive regions 61 are deformed in the thickness direction of the elastic body 20 with a smaller force, is obtained.

In addition, the method of manufacturing an electric connector according to this embodiment may include, after the step C of obtaining a precursor sheet, a step of causing the conductive members 30 included in the precursor sheet 1500 to protrude from at least one of the one principal surface 1500a and the another principal surface 1500b of the precursor sheet 1500.

In addition, the method of manufacturing an electric connector according to this embodiment may include, after the step D of obtaining an electric connector, a step of subjecting the end portions 30a and 30b of the conductive members 30 on at least one of the one principal surface 10a and the another principal surface 10b of the electric connector 10 to plating.

Fourth Embodiment

[Electric Connector]

Figure 6:
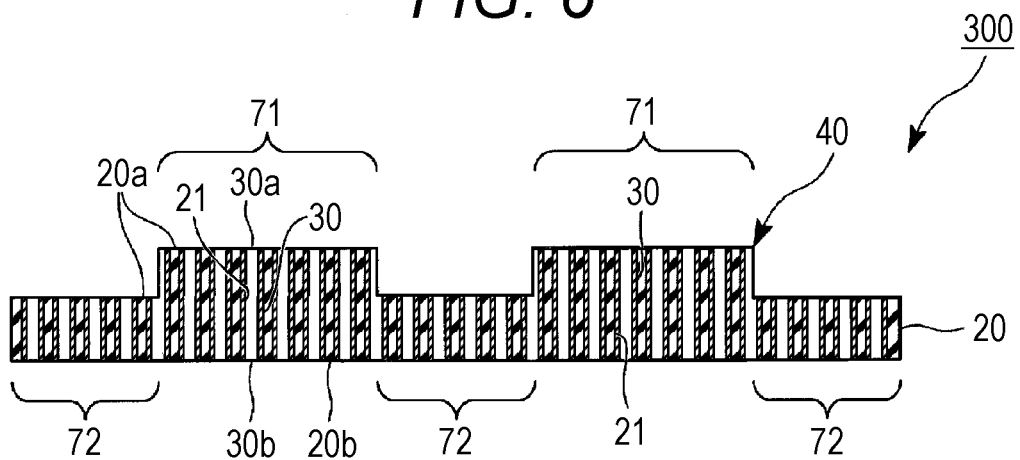
FIG. 6 is a sectional view for illustrating a schematic configuration of an electric connector according to a fourth embodiment.

FIG. 6 is a sectional view for illustrating a schematic configuration of an electric connector according to this embodiment. In FIG. 6, the same configurations as those of the electric connector according to the first embodiment illustrated in FIGS. 1A to 1C are denoted by the same reference symbols as those therein, and overlapping description of the same configurations is omitted.

As illustrated in FIG. 6, an electric connector 300 according to this embodiment includes a composite 40 including an elastic body 20 and conductive members 30.

In the electric connector 300 according to this embodiment, the composite 40 includes protruding portions 71 on one principal surface 20a side of the elastic body 20. The protruding portions 71 protrude in the thickness direction of the electric connector 300 (upward in the drawing sheet of FIG. 6). With this, the electric connector 300 according to this embodiment has an uneven surface formed by the protruding portions 71 and regions (hereinafter referred to as "thin layer portions") 72 each having a thickness smaller than that of the protruding portions 71 on the one principal surface 20a side of the elastic body 20.

The arrangement and number of the protruding portions 71 are not particularly limited, and are appropriately adjusted in accordance with the shapes of connection terminals of a device to be connected to the electric connector 300, and the like. More specifically, when the surface of the device, on which the connection terminals are provided, has unevenness, and the connection terminals are depressed, the arrangement and number of the protruding portions 71 are appropriately adjusted so as to correspond to the connection terminals.

The height from the thin layer portion 72 to the protruding portion 71 is preferably from 5 µm to 1,000 µm, more preferably from 10 µm to 500 µm.

The height from the thin layer portion 72 to the protruding portion 71 is obtained by measuring thicknesses at five positions of the protruding portion 71 through use of magnifying observation means such as a digital microscope and calculating an average value thereof. The thicknesses at five positions in the thin layer portion 72 are measured through use of magnifying observation means such as a digital microscope, and an average value thereof is calculated. The height is calculated based on the calculated values by the following expression.

Height from thin layer portion to protruding portion=Average thickness of protruding portion−Average thickness of thin layer portion In the electric connector 300 according to this embodiment, the composite 40 includes the protruding portions 71 that protrude in the thickness direction of the electric connector 300 on the one principal surface 20a side of the elastic body 20. Therefore, even when connection terminals of a device to be connected to the electric connector 300 are depressed, the electrical connection state between the conductive members 30 and the connection terminals of the device can be stably kept. In addition, in the electric connector 300 according to this embodiment, also when the structure of the connection terminals of the device to be connected to the electric connector 300 is a combination of a depressed shape and a concave shape, the electrical connection state between the conductive members 30 and the connection terminals of the device can be stably kept.

In this embodiment, there is illustrated the case in which the composite 40 includes the protruding portions 71 that protrude in the thickness direction of the electric connector 300 on the one principal surface 20a side of the elastic body 20, but this disclosure is not limited thereto. The composite 40 may include the protruding portions 71 that protrude in the thickness direction of the electric connector 300 on the one principal surface 20a side and the another principal surface 20b side of the elastic body 20.

Further, also in this embodiment, the conductive member 30 may be joined to the through hole 21 in a state of protruding from at least one of the one principal surface 20a and the another principal surface 20b of the elastic body 20. In addition, in the conductive member 30, the plated layers 35 and 36 may be formed on the end portions 30a and 30b protruding from at least one of the one principal surface 20a and the another principal surface 20b of the elastic body 20.

In addition, in this embodiment, a part of the protruding portion 71 or the thin layer portion 72 may form the non-conductive region 62 in the third embodiment in accordance with the shapes of connection terminals of a device to be connected to the electric connector 300, and the like.

[Method of Manufacturing Electric Connector]

A method of manufacturing an electric connector according to this embodiment includes: a step (step A) of forming the above-mentioned conductive member-containing sheet; a step (step B) of forming a laminate of the conductive member-containing sheets; a step (step C) of cutting the laminate to obtain a precursor sheet; a step (step D) of obtaining the above-mentioned electric connector; and a step (hereinafter referred to as "step K") of removing parts of the electric connector in a thickness direction thereof from at least one principal surface side of the electric connector, to thereby form thin layer portions in the electric connector.

Now, the method of manufacturing an electric connector according to this embodiment is described with reference to FIGS. 2A to 2D, FIG. 6, FIGS. 7A, and 7B.

Figure 7A:
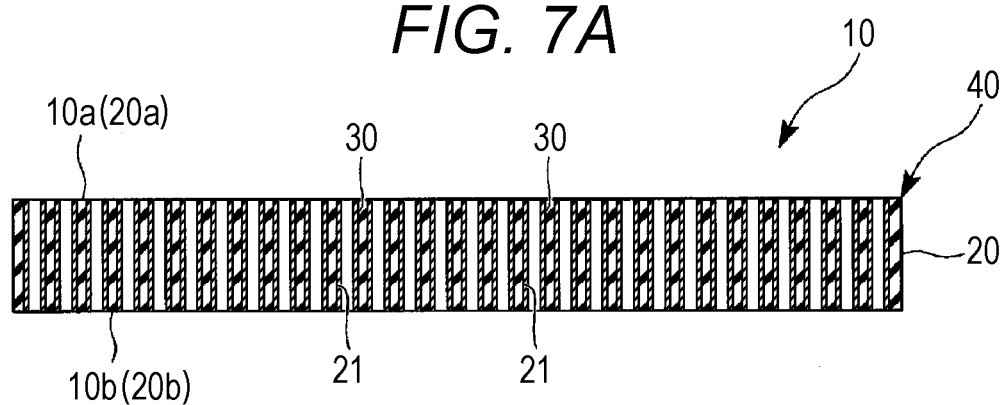
FIGS. 7A and 7B are sectional views for illustrating an overview of a method of manufacturing the electric connector according to the fourth embodiment.

In the method of manufacturing an electric connector according to this embodiment, the steps A to D are performed to obtain the electric connector 10 of FIG. 7A, in the same manner as in the method of manufacturing an electric connector according to the first embodiment.

Figure 7B:
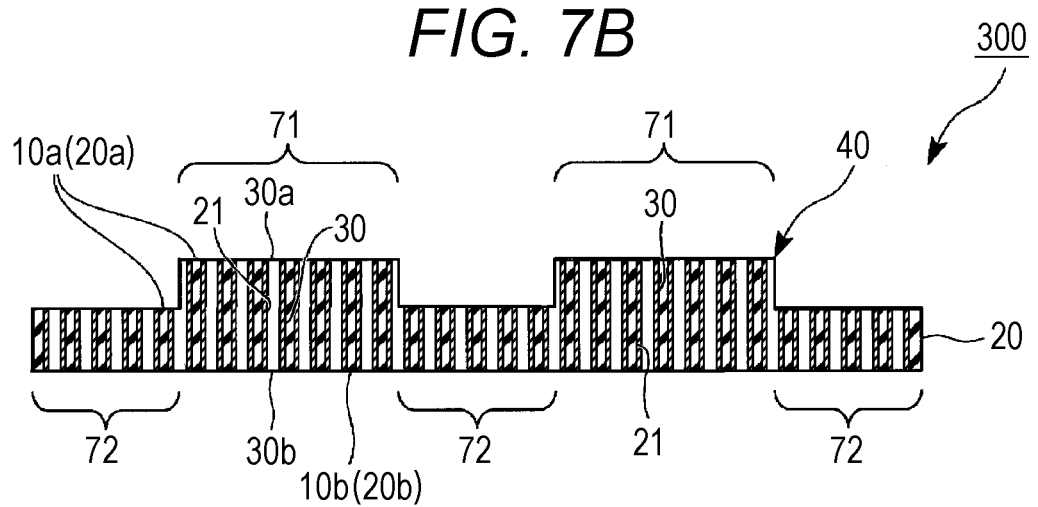

Then, as illustrated in FIG. 7B, parts of the electric connector 10 are removed in the thickness direction from the one principal surface 10a side of the electric connector 10, to thereby form, in the electric connector 10, the thin layer portions 72 that are recessed in the thickness direction of the electric connector 10 (step K).

In the step K, as a method of removing the electric connector 10, for example, laser etching, mechanical processing such as cutting, or the like is used.

Through the steps A to K, the electric connector 300 illustrated in FIG. 6 is obtained.

In the method of manufacturing an electric connector according to this embodiment, it is possible to manufacture the electric connector 300 capable of stably keeping the electrical connection state between the conductive members 30 and the connection terminals of the device to be connected to the electric connector 300 even when the connection terminals of the device are depressed.

In this embodiment, there is illustrated the case in which the thin layer portions 72 that are recessed in the thickness direction of the electric connector 10 are formed, in the electric connector 10, on the one principal surface 10a side of the electric connector 10. However, this disclosure is not limited thereto. After the step C of obtaining a precursor sheet, the thin layer portions 72 that are recessed in the thickness direction of the electric connector 10 may be formed, in the electric connector 10 forming the precursor sheet 1500, on the one principal surface 20a side and the another principal surface 20b side of the elastic body 20.

In addition, the method of manufacturing an electric connector according to this embodiment may include, after the step C of obtaining a precursor sheet, a step of causing the conductive members 30 included in the precursor sheet 1500 to protrude from at least one of the one principal surface 1500a and the another principal surface 1500b of the precursor sheet 1500.

In addition, the method of manufacturing an electric connector according to this embodiment may include, after the step D of obtaining an electric connector, a step of subjecting the end portions 30a and 30b of the conductive members 30 on at least one of the one principal surface 10a and the another principal surface 10b of the electric connector 10 to plating.

Fifth Embodiment

[Electric connector]

Figure 8:
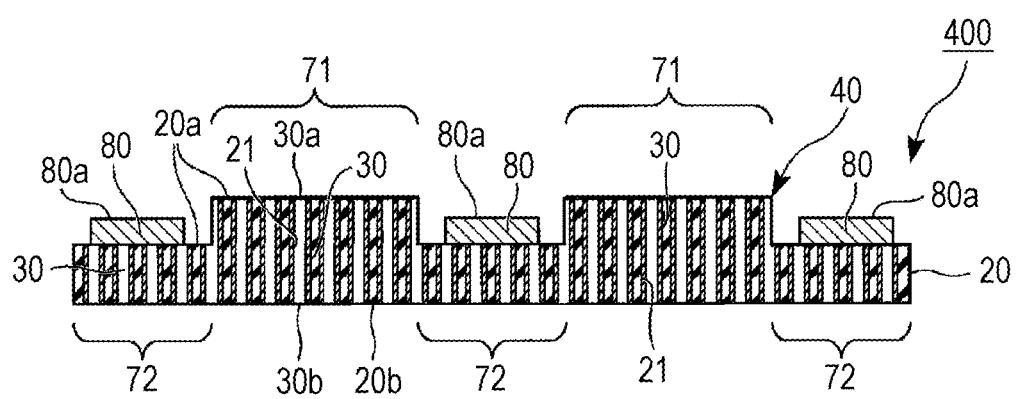
FIG. 8 is a sectional view for illustrating a schematic configuration of an electric connector according to a fifth embodiment.

FIG. 8 is a sectional view for illustrating a schematic configuration of an electric connector according to this embodiment. In FIG. 8, the same configurations as those of the electric connectors according to the first embodiment illustrated in FIGS. 1A to 1C and the fourth embodiment illustrated in FIG. 6 are denoted by the same reference symbols as those therein, and overlapping description of the same configurations is omitted.

As illustrated in FIG. 8, an electric connector 400 according to this embodiment includes a composite 40 including an elastic body 20 and conductive members 30.

In the electric connector 400 according to this embodiment, the composite 40 includes protruding portions 71 that protrude in a thickness direction of the electric connector 400 (upward in the drawing sheet of FIG. 8) and thin layer portions 72 each having a thickness smaller than that of the protruding portions 71 on the one principal surface 20a side of the elastic body 20, and a sheet-shaped member 80 made of a resin is laminated on each of the thin layer portions 72.

It is preferred that, in the thin layer portion 72, an outermost surface (end surface) of one end portion 30a of each of the conductive members 30 be at least in flush with a surface (upper surface) 80a of the sheet-shaped member 80 and protrude from the surface (upper surface) 80a of the sheet-shaped member 80.

The thickness of the sheet-shaped member 80 is not particularly limited, and is appropriately adjusted in accordance with elasticity required in the composite 40. It is preferred that the thickness of the sheet-shaped member 80 be from 0.01 mm to 0.5 mm.

The size of the sheet-shaped member 80 in plan view is preferably from 50% by area to 98% by area with respect to the entire area of the thin layer portion 72 in plan view.

A material of the sheet-like member 80 is not particularly limited as long as the sheet-like member 80 has heat resistance and dimensional stability when formed into the sheet-like member 80. Examples of such material include polyimide (PI), an epoxy resin, polyethylene terephthalate (PET), polybutylene terephthalate (PBT), polyvinyl chloride, polystyrene, polyacrylonitrile, polyethylene, polypropylene, acryl, polybutadiene, polyphenylene ether (PPE), polyphenylene sulfide (PPS), polyether ether ketone (PEEK), a liquid crystal polymer (LCP), polyamideimide (PAI), polyetherimide (PEI), polyethersulfone (PES), and polycarbonate (PC). Of those, polyimide (PI), polyphenylene sulfide (PPS), polyether ether ketone (PEEK), and liquid crystal polymer (LCP) are preferred from the viewpoint of excellent heat resistance and dimension stability.

The sheet-shaped member 80 may be non-woven fabric made of those resins.

In the electric connector 400 according to this embodiment, the composite 40 includes the protruding portions 71 that protrude in the thickness direction of the electric connector 400 and the thin layer portions 72 each having a thickness smaller than that of the protruding portions 71 on the one principal surface 20a side of the elastic body 20, and the sheet-shaped member 80 made of a resin is laminated on each of the thin layer portions 72. Therefore, the laminate including the composite 40 and the sheet-shaped members 80 is excellent in heat resistance and dimension stability as compared to the case of only the composite 40, and thus the electrical connection state between the conductive members 30 and connection terminals of a device to be connected to the electric connector 400 can be stably kept.

In this embodiment, there is illustrated the case in which the composite 40 includes the protruding portions 71 that protrude in the thickness direction of the electric connector 400 and the thin layer portions 72 on the one principal surface 20a side of the elastic body 20, and the sheet-shaped member 80 made of a resin is laminated on all of the thin layer portions 72. However, this disclosure is not limited thereto. The sheet-shaped members 80 made of a resin may be laminated on parts of the thin layer portions 72. In addition, the composite 40 may include the protruding portions 71 that protrude in the thickness direction of the electric connector 400 and the thin layer portions 72 on the one principal surface 20a side and the another principal surface 20b side of the elastic body 20, and the sheet-shaped member 80 made of a resin may be laminated on each of the thin layer portions 72 on both sides. In addition, the sheet-shaped member 80 made of a resin may be laminated also on each of the protruding portions 71.

Further, also in this embodiment, the conductive member 30 may be joined to the through hole 21 in a state of protruding from at least one of the one principal surface 20a and the another principal surface 20b of the elastic body 20. In addition, in the conductive member 30, the plated layers 35 and 36 may be formed on the end portions 30a and 30b protruding from at least one of the one principal surface 20a and the another principal surface 20b of the elastic body 20.

In addition, also in this embodiment, a part of the protruding portion 71 or the thin layer portion 72 may form the non-conductive region 62 in the third embodiment in accordance with the shapes of connection terminals of a device to be connected to the electric connector 400, and the like.

[Method of Manufacturing Electric Connector]

A method of manufacturing an electric connector according to this embodiment includes: a step (step A) of forming the above-mentioned conductive member-containing sheet; a step (step B) of forming a laminate of the conductive member-containing sheets; a step (step C) of cutting the laminate to obtain a precursor sheet; a step (step D) of obtaining the above-mentioned electric connector; a step (step K) of forming the above-mentioned protruding portions; and a step (hereinafter referred to as "step L") of laminating a sheet-shaped member made of a resin on at least a part of a region obtained by removing a part of the electric connector on at least one principal surface side of the electric connector.

Now, the method of manufacturing an electric connector according to this embodiment is described with reference to FIGS. 2A to 2D, FIG. 8, and FIGS. 9A to 9c.

Figure 9A:
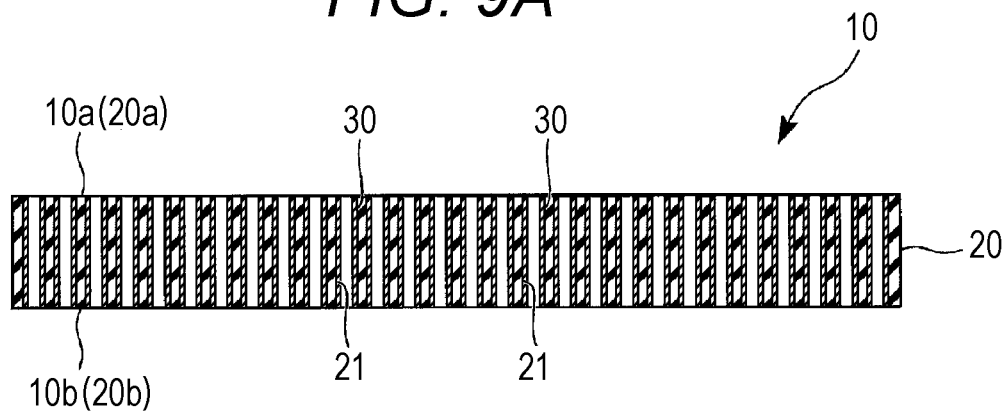
FIGS. 9A to 9C are sectional views for illustrating an overview of a method of manufacturing the electric connector according to the fifth embodiment.

In the method of manufacturing an electric connector according to this embodiment, the steps A to D are performed to obtain the electric connector 10 of FIG. 9A, in the same manner as in the method of manufacturing an electric connector according to the first embodiment.

Figure 9B:
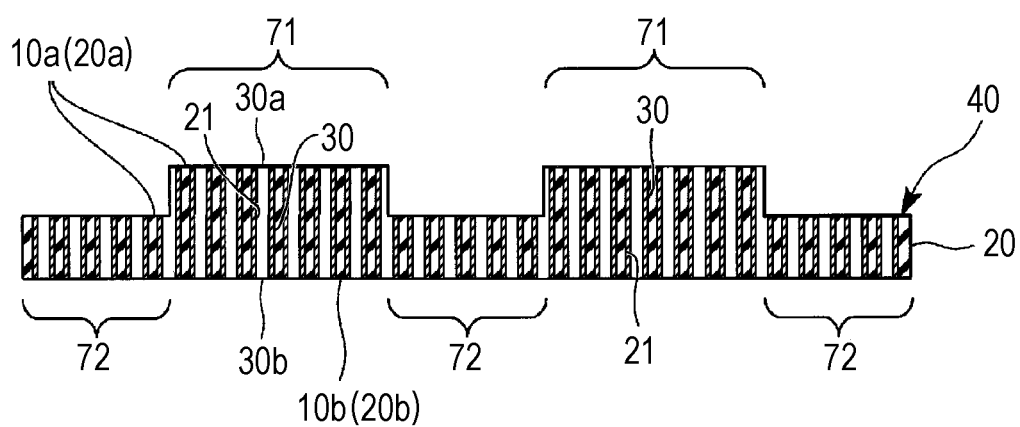

Then, as illustrated in FIG. 9B, parts of the electric connector 10 are removed in the thickness direction from the one principal surface 10a side of the electric connector 10, to thereby form, in the electric connector 10, the protruding portions 71 that protrude in the thickness direction of the electric connector 10 (step K).

Figure 9C:
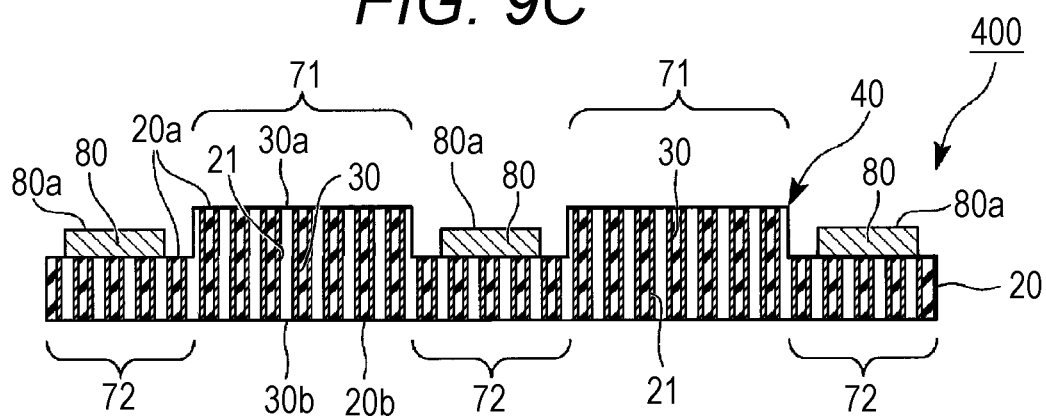

Then, as illustrated in FIG. 9C, the sheet-shaped member 80 made of a resin is laminated on at least a part of a region obtained by removing a part of the electric connector 10 on the one principal surface 10a side of the electric connector 10.

In the step L, as a method of laminating the sheet-shaped members 80 on the thin layer portions 72, for example, a method involving bonding the sheet-shaped members 80 to the thin layer portions 72 with an adhesive, a method involving bonding the sheet-shaped members 80 to the thin layer portions 72 by surface treatment through irradiation of an excimer, or the like is used.

In addition, in the step L, as a positioning method at a time of bonding the sheet-shaped members 80 to the thin layer portions 72, there are given, for example, a method involving showing marks for positioning (marking) in portions in which the conductive members 30 are not arranged in the electric connector 10 and in the vicinity of the end portions of the sheet-shaped members 80 and performing positioning through image recognition, and a method involving forming convex portions and concave portions for positioning on the electric connector 10, followed by fitting.

Through the steps A to L, the electric connector 400 illustrated in FIG. 8 is obtained.

In the method of manufacturing an electric connector according to this embodiment, it is possible to manufacture the electric connector 400 capable of stably keeping the electrical connection state between the conductive members 30 and the connection terminals of the device to be connected to the electric connector 400, and in which the laminate including the composite 40 and the sheet-shaped members 80 is excellent in heat resistance and dimension stability as compared to the case of only the composite 40.

In this embodiment, there is illustrated the case in which the protruding portions 71 that protrude in the thickness direction of the electric connector 400 are formed, in the electric connector 10, on the one principal surface 10a side of the electric connector 10. However, this disclosure is not limited thereto. After the step C of obtaining a precursor sheet, the protruding portions 71 that protrude in the thickness direction of the electric connector 400 may be formed, in the electric connector 10 forming the precursor sheet 1500, on the one principal surface 20a side and the another principal surface 20b side of the elastic body 20.

In addition, in this embodiment, there is illustrated the case in which the sheet-shaped member 80 made of a resin is laminated on each of the thin layer portions 72 on the one principal surface 20a side of the elastic body 20 in the step L. However, this disclosure is not limited thereto. The sheet-shaped member 80 made of a resin may be laminated on each of the thin layer portions 72 on the one principal surface 20a side and the another principal surface 20b side of the elastic body 20 in the step L. In addition, the sheet-shaped member 80 may be laminated also on each of the protruding portions 71.

In addition, the method of manufacturing an electric connector according to this embodiment may include, after the step C of obtaining a precursor sheet, a step of causing the conductive members 30 included in the precursor sheet 1500 to protrude from at least one of the one principal surface 1500a and the another principal surface 1500b of the precursor sheet 1500.

In addition, the method of manufacturing an electric connector according to this embodiment may include, after the step D of obtaining an electric connector, a step of subjecting the end portions 30a and 30b of the conductive members 30 on at least one of the one principal surface 10a and the another principal surface 10b of the electric connector 10 to plating. In addition, in the same manner as in the third embodiment, the non-conductive region 62 may be formed in a part of the protruding portion 71 or the thin layer portion 72.

The electric connector of this disclosure is arranged between the connection terminals of the first device and the connection terminals of the second device, and is used for electrically connecting the connection terminals of the first device and the connection terminals of the second device to each other.

The method of using the electric connector of this disclosure includes arranging the electric connector between the connection terminals of the first device and the connection terminals of the second device, and electrically connecting the connection terminals of the first device and the connection terminals of the second device to each other.

EXAMPLES

Now, this disclosure is further specifically described in Examples and Comparative Examples, but this disclosure is not limited to the following Examples.

Comparative Example 1

A plurality of composite members were arranged on one surface of a first resin layer having a thickness of 15 μm made of a silicone rubber formed on a polyethylene terephthalate base material in parallel to each other at suitable intervals with the plurality of composite members being aligned with each other in the same direction.

As the composite member, a composite member including a cylindrical core member having a diameter of 25 μm made of brass and a metal layer having a thickness of 0.2 μm made of gold formed on an outer peripheral surface of the core member was used.

Then, a second resin layer having a thickness of 15 μm made of a silicone rubber was formed on the one surface of the first resin layer on which the plurality of composite members were arranged. The second resin layer was integrated with the first resin layer, and the composite members were fixed between the first resin layer and the second resin layer, to thereby form a conductive member-containing sheet.

Then, 200 conductive member-containing sheets were laminated on one another with the composite members being aligned with each other in the same direction, to thereby form a laminate of the conductive member-containing sheets.

Then, the laminate was cut to a thickness of 150 μm at an angle of 63° with respect to an extending direction of the composite members by cutting processing, to thereby obtain a precursor sheet formed of an elastic body having through holes each having the conductive member, which was cut into a round slice, joined thereto. The angle of the conductive member in an extending direction on an acute angle side with respect to the thickness direction of the precursor sheet was 27°.

In Comparative Example 1, the precursor sheet was used as an electric connector.

Figure 10:
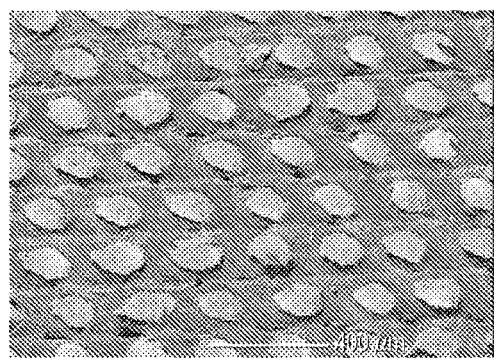
FIG. 10 is a scanning transmission electron microscopic image of an electric connector of Comparative Example 1.

The electric connector of Comparative Example 1 was observed with a scanning electron microscope (SEM) (model number: JCM-6000, manufactured by JEOL Ltd.). The result is shown in FIG. 10. It was confirmed from the result of FIG. 10 that, in the electric connector of Comparative Example 1, the conductive members were solid over the length direction.

Example 1

The precursor sheet obtained in Comparative Example 1 was immersed in an etchant containing nitric acid, and the core member was corroded and dissolved with the etchant to be removed from each of the composite members in the through holes, to thereby bring at least a part of a vicinity of distal ends on a cut surface of the precursor sheet and a surface side on an opposite side of the cut surface in each of the conductive members into a hollow state. Thus, the electric connector of Example 1 was obtained.

Figure 11:
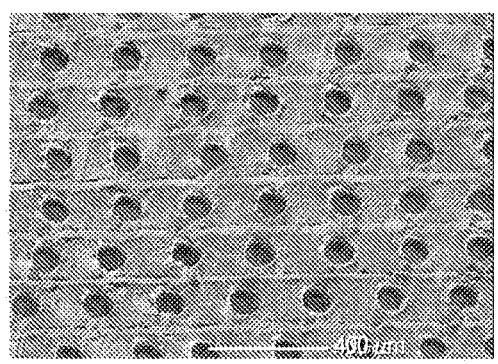
FIG. 11 is a scanning transmission electron microscopic image of an electric connector of Example 1.

The electric connector of Example 1 was observed with a scanning electron microscope in the same manner as in Comparative Example 1. The result is shown in FIG. 11. It was confirmed from the result of FIG. 11 that, in the electric connector of Example 1, at least a region of from 10 μm to 30 μm from each of both ends of the conductive member was hollow.

Example 2

The precursor sheet obtained in Comparative Example 1 was immersed in an etchant containing nitric acid for a time period longer than that in Example 1, and the core member was corroded and dissolved with the etchant to be removed from each of the composite members in the through holes, to thereby bring at least a part of a vicinity of distal ends on a cut surface of the precursor sheet and a surface side on an opposite side of the cut surface in each of the conductive members into a hollow state. Thus, the electric connector of Example 2 was obtained.

Figure 12:
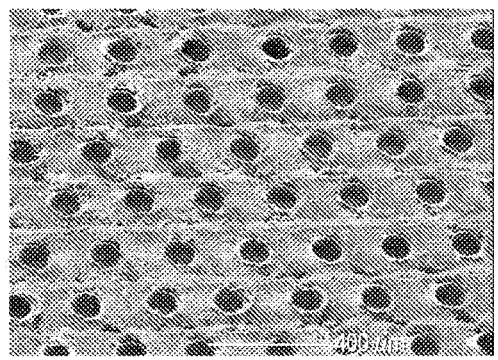
FIG. 12 is a scanning transmission electron microscopic image of an electric connector of Example 2.

The electric connector of Example 2 was observed with a scanning electron microscope in the same manner as in Comparative Example 1. The result is shown in FIG. 12. It was confirmed from the result of FIG. 12 that, in the electric connector of Example 2, at least a region of 50 μm or more from each of both ends of the conductive member was hollow. In addition, when the electric connector was irradiated with light from the surface on the opposite side of the cut surface, light was not recognized from the conductive members on the cut surface.

Example 3

The precursor sheet obtained in Comparative Example 1 was immersed in an etchant containing nitric acid for a time period longer than that in Example 2, and the core member was corroded and dissolved with the etchant to be removed from each of the composite members in the through holes, to thereby bring at least a part of a vicinity of distal ends on a cut surface of the precursor sheet and a surface side on an opposite side of the cut surface in each of the conductive members into a hollow state. Thus, the electric connector of Example 3 was obtained.

Figure 13:
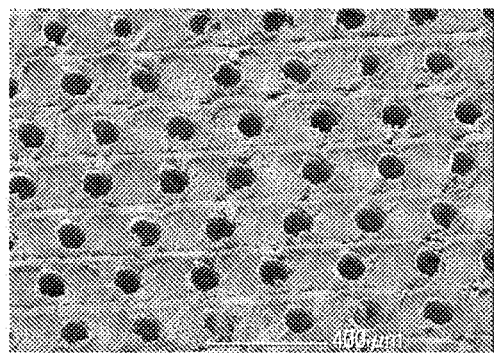
FIG. 13 is a scanning transmission electron microscopic image of an electric connector of Example 3.

The electric connector of Example 3 was observed with a scanning electron microscope in the same manner as in Comparative Example 1. The result is shown in FIG. 13. It was confirmed from the result of FIG. 13 that, in the electric connector of Example 3, at least a region of 50 μm or more from each of both ends of the conductive member was hollow. In addition, when the electric connector was irradiated with light from the surface on the opposite side of the cut surface, light was recognized from the conductive members on the cut surface. Therefore, it was confirmed that the conductive members were hollow over the length direction, that is, the conductive members had through holes.

[Evaluation]

Each of the electric connectors of Comparative Example 1 and Examples 1 to 3 was arranged between a probe plated with gold having a diameter of 1.0 mm and a substrate having connection terminals plated with gold to form a laminate (test apparatus).

In addition, in order to measure a resistance value between the probe and the substrate, a resistance meter (product name: RM3545-01, manufactured by Hioki E.E. Corporation) was connected to the probe and the substrate.

In this state, while the laminate was compressed in a thickness direction thereof, the resistance value between the probe and the substrate was measured, to thereby investigate a relationship between the displacement amount of the laminate (amount of the laminate compressed in the thickness direction) and the resistance value between the probe and the substrate. The displacement amount of the laminate was equal to that of the electric connector.

In addition, at the time of compressing the laminate, a load applied to the laminate was measured by an automatic load tester (product name: MAX-1KN-S-1, manufactured by Japan Instrumentation System, Co., Ltd.), to thereby investigate a relationship between the displacement amount of the laminate and the load.

From the above-mentioned result, a relationship between a resistance value between the probe and the substrate and a load applied to the electric connector was investigated. The result is shown in FIG. 14.

Figure 14:
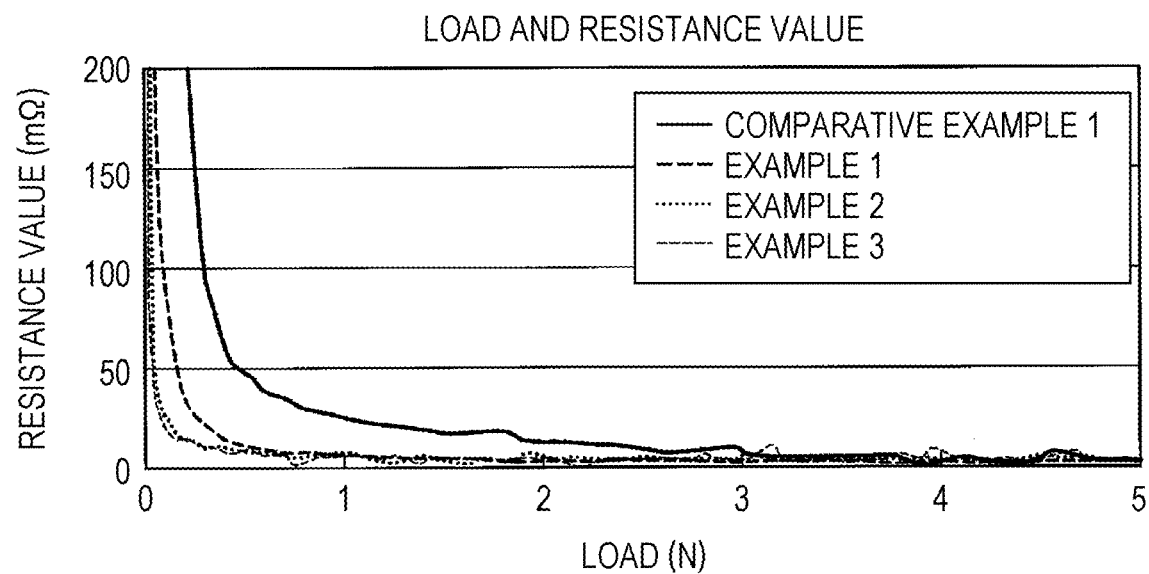
FIG. 14 is a graph for showing a relationship between a resistance value between two devices and a load applied to an electric connector regarding the electric connectors of Comparative Example 1 and Examples 1 to 3.

The following is understood from the result of FIG. 14. In the electric connectors of Examples 1 to 3, a resistance value becomes low even with a small load. Therefore, an excessive force is not applied to the connection terminals of the device from the conductive members, and the connection terminals can be prevented from being damaged.

Comparative Example 2

A plurality of composite members were arranged on one surface of a first resin layer having a thickness of 15 μm made of a silicone rubber formed on a polyethylene terephthalate base material in parallel to each other at suitable intervals with the plurality of composite members being aligned with each other in the same direction.

As the composite member, a composite member including a cylindrical core member having a diameter of 25 μm made of brass and a metal layer having a thickness of 0.1 μm made of gold formed on an outer peripheral surface of the core member was used.

Then, a second resin layer having a thickness of 15 μm made of a silicone rubber was formed on the one surface of the first resin layer on which the plurality of composite members were arranged. The second resin layer was integrated with the first resin layer, and the composite members were fixed between the first resin layer and the second resin layer, to thereby form a conductive member-containing sheet.

Then, 200 conductive member-containing sheets were laminated on one another with the composite members being aligned with each other in the same direction, to thereby form a laminate of the conductive member-containing sheets.

Then, the laminate was cut to a thickness of 150 μm at an angle of 63° with respect to an extending direction of the composite members by cutting processing, to thereby obtain a precursor sheet formed of an elastic body having through holes each having the conductive member, which was cut into a round slice, joined thereto. The angle of the conductive member in an extending direction on an acute angle side with respect to the thickness direction of the precursor sheet was 27°.

In Comparative Example 2, the precursor sheet was used as an electric connector. Pitches between the centers of the respective conductive members in the precursor sheet was $P_1=P_2=50$ µm with reference to $P_1$ and $P_2$ in FIG. 1.

The electric connector of Comparative Example 2 was observed with a scanning electron microscope (SEM) (model number: JCM-6000, manufactured by JEOL Ltd.). It was confirmed that, in the electric connector of Comparative Example 2, the conductive members were solid over the length direction.

Example 4

The precursor sheet obtained in Comparative Example 2 was immersed in an etchant containing nitric acid, and the core member was corroded and dissolved with the etchant to be removed from each of the composite members in the through holes, to thereby bring at least a part of a vicinity of distal ends on a cut surface of the precursor sheet and a surface side on an opposite side of the cut surface in each of the composite members into a hollow state. Thus, the electric connector of Example 4 was obtained.

The electric connector of Example 1 was observed with a scanning electron microscope in the same manner as in Comparative Example 2. It was confirmed that, in the electric connector of Example 4, each of the conductive members was a hollow body having an inner diameter of 25 µm.

Examples 5 to 12

Each of electric connectors was obtained in the same manner as in Example 4 except that the thickness of the electric connector, the thickness of the metal layer, and the angle of the through hole with respect to the thickness direction of the electric connector were changed as shown in Table 1.

Example 13

After an electric connector was obtained in the same manner as in Example 6, surfaces of both principal surfaces of the electric connector were subjected to laser etching through use of a carbon dioxide laser, to thereby cut a silicone rubber forming each of the principal surfaces to a depth of about 15 µm. As a result, the end portion of each of the conductive members protruded to a height of about 15 µm from the surface of each of the principal surfaces.

Example 14

After an electric connector was obtained in the same manner as in Example 6, surfaces of both principal surfaces of the electric connector were subjected to laser etching through use of a carbon dioxide laser, to thereby cut a silicone rubber forming each of the principal surfaces to a depth of about 30 µm. As a result, the end portion of each of the conductive members protruded to a height of about 30 µm from the surface of each of the principal surfaces. A connection stability test, a connection terminal damage resistance test, and a durability test were performed through use of the electric connector obtained in each of Examples as follows.

<Test Method 1>

The electric connector to be tested was set between a cylindrical conductive probe plated with gold and a substrate having connection terminals plated with gold. In addition, the above-mentioned resistance meter configured to measure a resistance value between the conductive probe and the substrate was connected to the above-mentioned automatic load tester configured to measure a load to be applied at a time of compression of the electric connector.

In this test device, a distal end portion having a diameter of 0.14 mm of the conductive probe was pressed against the end portions of the conductive members exposed to the first surface of the electric connector, and the conductive probe was pushed in the end portions under a condition of a movement speed of 0.05 mm/min. With this, the electric connector was compressed until a compression load reached 0.15 N. During compression, a resistance value between the probe and the substrate was measured.

<Connection Stability Test>

Connection stability was evaluated with the following evaluation reference based on the resistance value given when the compression load measured in the test method 1 was 0.15N. The result is shown in Table 1.

A: Less than 50 mΩ. The resistance value is low, and connection is stably performed.

B: 50 mΩ or more and less than 150 mΩ. The resistance value is relatively high, but connection can be performed.

C: 150 mΩ or more. The resistance value is high, and connection is unstable.

Figure 15:
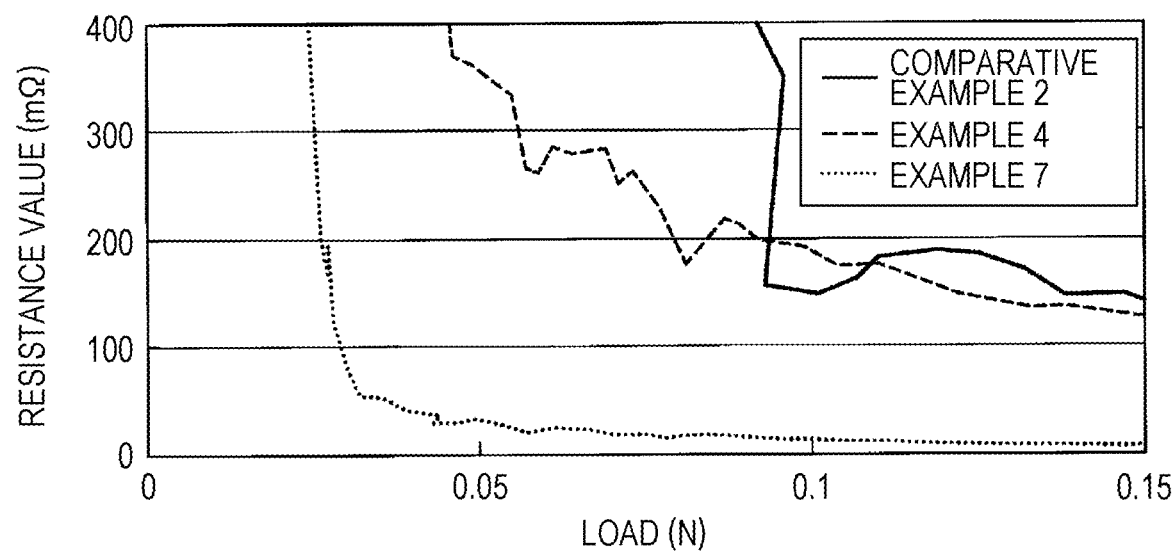
FIG. 15 is a graph for showing a relationship between a resistance value between two devices and a load applied to an electric connector regarding electric connectors of Comparative Example 2 and Examples 4 and 7.

As the result of the connection stability test, a graph showing a relationship between the resistance value and the load in Comparative Example 2 and Examples 4 and 7 is shown in FIG. 15. In Comparative Example 2, even when the load was applied up to 0.15 N, connection did not become stable. Meanwhile, in Examples 4 and 7, the resistance value was gradually decreased and reached 150 mΩ or less with a load of 0.12 N or more, and connection was stable with a low load. It was shown from the comparison between Example 4 and Example 7 that stable connection was obtained with a lower load in Example 7 including a thick metal layer.

Figure 16:
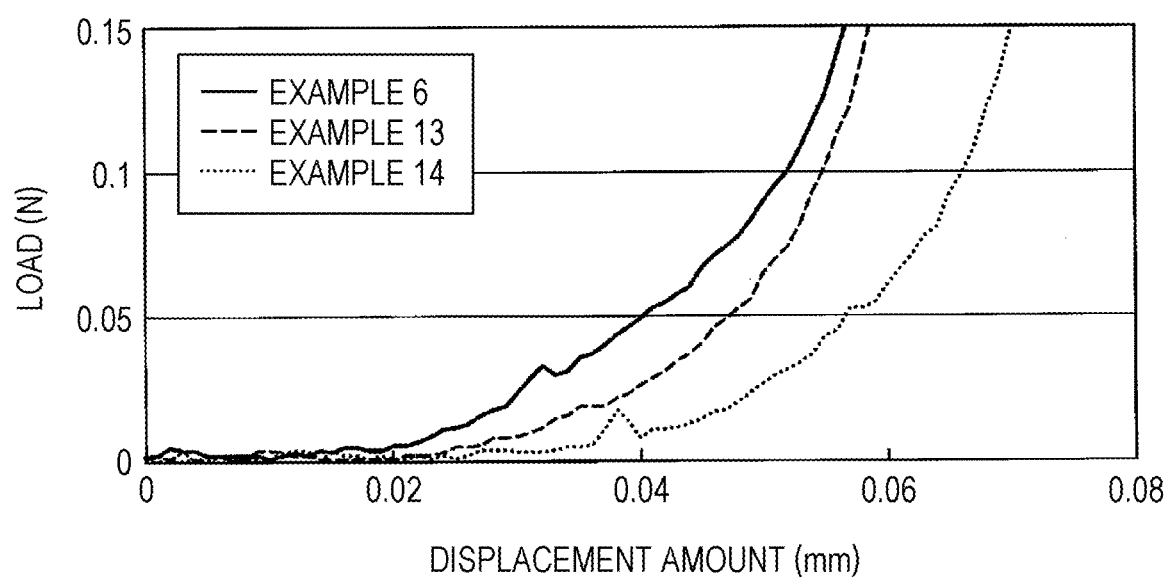
FIG. 16 is a graph for showing a relationship between a load applied to an electric connector and a compression distance (displacement amount) of the electric connector regarding electric connectors of Examples 6, 13, and 14.

As the result of the connection stability test, a graph for showing a relationship between the load and the displacement amount (compression distance) in Examples 6, 13, and 14 is shown in FIG. 16. As the length of the end portion of each of the conductive members protruding from the principal surface of the electric connector was increased, the load with respect to the displacement amount was decreased. This result shows that the protrusion of the end portion facilitates elastic deformation of the conductive member, with the result that stable connection can be performed with a low load.

Figure 17:
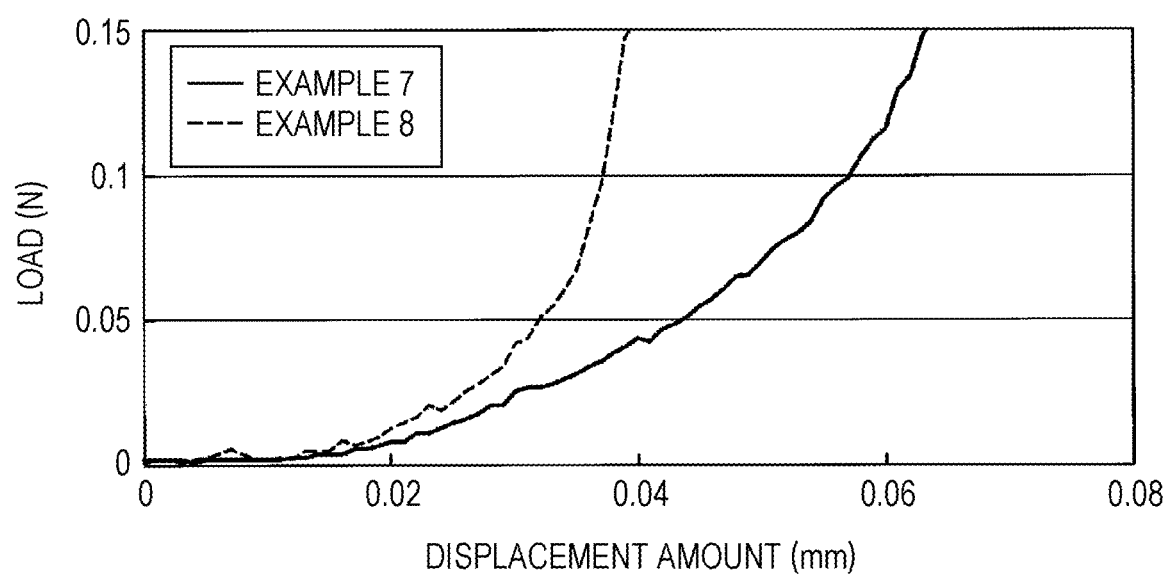
FIG. 17 is a graph for showing a relationship between a load applied to an electric connector and a compression distance (displacement amount) of the electric connector regarding electric connectors of Examples 7 and 8.

As the result of the connection stability test, a graph for showing a relationship between the load and the displacement amount (compression distance) in Examples 7 and 8 is shown in FIG. 17. The load with respect to the displacement amount was decreased in Example 7 in which the through holes and the conductive members obliquely crossed the principal surface of the electric connector (at an angle of 27° with respect to the thickness direction of the through holes), as compared to Example 8 in which the through holes and the conductive members perpendicularly crossed the principal surface of the electric connector. This result shows that, when the conductive members have a gradient with respect to the thickness direction of the electric connector, the conductive members are more likely to be elastically deformed and can be stably connected with a low load.

<Test Method 2>

A copper foil tape including a copper layer having a thickness of 35 μm and a conductive pressure-sensitive adhesive having a thickness of 25 μm was bonded to a surface of a glass substrate, and the electric connector to be tested was placed on the copper layer so that the first surface of the electric connector was brought into contact with the copper layer. A distal end portion having a diameter of 1 mm of a cylindrical compression probe was pressed against an end portion of each of the conductive members exposed to the second surface on an opposite side of the first surface.

The compression probe was pressed against the end portion under a condition of a movement speed of 0.05 mm/min to compress the electric connector. After the electric connector was compressed until the compression load reached 8 N, the probe was detached to cancel the compression. The compressed electric connector was removed from the test device, and a region of the copper foil against which the compression probe was pressed was observed with an electron microscope. Thus, the presence or absence of flaws on the surface of the copper foil was investigated.

<Connection Terminal Damage Resistance Test>

Connection terminal damage resistance was evaluated with the following evaluation reference based on the result obtained by observing the surface of the copper foil with the electron microscope in the test method 2. The result is shown in Table 1.

A: An obvious flaw is not observed. There is no risk in that connection terminals are damaged.

B: An obvious flaw is observed. There is a risk in that connection terminals are damaged.

<Test Method 3>

In the same manner as in the test method 1, the electric connector to be tested was set between a cylindrical conductive probe plated with gold and a substrate having connection terminals plated with gold. The resistance meter was connected to the automatic load tester.

In this test device, a distal end portion having a diameter of 0.14 mm of the conductive probe was pressed against the end portions of the conductive members exposed to the first surface of the electric connector, and the conductive probe was pushed in the end portions by 0.060 mm under a condition of a movement speed of 100 mm/min. Then, a separating compression operation was repeated 35,000 times. After that, a resistance value between the probe and the copper layer was measured.

<Durability Test>

Durability was evaluated with the following evaluation reference based on the resistance value measured in the test method 3. The result is shown in Table 1.

A: The resistance value after compression of 35,000 times is less than 200 mΩ. The durability is excellent.

B: The resistance value after compression of 35,000 times is 200 mΩ or more and less than 500 mΩ. The durability is satisfactory.

C: The resistance value after compression of 35,000 times is 500 mΩ or more. The durability is low.

NT: A test is not conducted.

TABLE 1

| | No. | Thickness of electric connector (μm) | Shape of conductive member | Thickness of metal (Au) layer (μm) | Angle of through hole | Protrusion of end portion of conductive member | Connection stability | Connection terminal damage resistance | Durability |
|---|---|---|---|---|---|---|---|---|---|
| Comparative Example | 2 | 150 | Solid | 0.1 | 27° | None | C | C | A |
| Example | 4 | 150 | Hollow body | 0.1 | 27° | | B | A | NT |
| | 5 | | | 0.5 | 27° | | A | A | B |
| | 6 | | | 0.5 | 0° | | A | A | B |
| | 7 | | | 1 | 27° | | A | A | A |
| | 8 | | | 1 | 0° | | A | A | A |
| | 9 | 300 | | 0.5 | 27° | | A | A | NT |
| | 10 | | | 0.5 | 0° | | A | A | NT |
| | 11 | | | 1 | 27° | | A | A | NT |
| | 12 | | | 1 | 0° | | A | A | NT |
| | 13 | 150 | | 0.5 | 0° | Protruding by 15 μm from both ends | A | A | NT |
| | 14 | | | 0.5 | 0° | Protruding by 30 μm from both ends | A | A | NT |

INDUSTRIAL APPLICABILITY

According to this disclosure, an electric connector capable of stably connecting without application of an excessive force to a connection terminal of a device to be connected to the electric connector from a conductive member of the electric connector, and a method of manufacturing the electric connector can be provided.

The invention claimed is:

1. An electric connector, which is to be arranged between a connection terminal of a first device and a connection terminal of a second device, and is configured to electrically connect the connection terminal of the first device and the connection terminal of the second device to each other,
   the electric connector comprising a composite, the composite including:
   an elastic body having a plurality of through holes that penetrate therethrough in a thickness direction; and
   a conductive member formed of a metal layer, which is joined to an inner wall of each of the through holes, and is configured to electrically connect the connection terminal of the first device and the connection terminal of the second device to each other,
   wherein at least a part of a vicinity of at least one of distal ends of the conductive member defines a continuous hollow in a direction parallel to the through hole,
   wherein the composite includes a protruding portion that protrudes in the thickness direction of the elastic body on at least the one principal surface side of the elastic body; and a sheet-shaped member made of a resin, which is laminated on at least a part of a thin layer portion having a thickness smaller than a thickness of the protruding portion, on at least the one principal surface side of the elastic body, wherein the sheet-shaped member exhibits excellent heat resistance and dimensional stability, and the sheet-shaped member directly contacts at least one conductive member.

2. The electric connector according to claim 1, wherein the conductive member is hollow over an entire length of the conductive member.

3. The electric connector according to claim 1, wherein the conductive member has at least one metal layer made of a noble metal.

4. The electric connector according to claim 1, wherein each of the through holes penetrates through the elastic body obliquely to a thickness direction of the elastic body.

5. The electric connector according to claim 1, wherein the conductive member includes an end portion that protrudes from at least one of one principal surface and another principal surface of the elastic body.

6. The electric connector according to claim 1, wherein the end portion of the conductive member has a plated layer formed thereon.

7. The electric connector according to claim 1, wherein the composite includes, on the one principal surface and the another principal surface of the elastic body, a plurality of conductive regions each including the through holes, each of the through holes having the conductive member joined thereto, and a non-conductive region, which is formed between the plurality of conductive regions, and includes the through holes, each of the through holes being free of the conductive member.

8. The electric connector according to claim 7, wherein the non-conductive region is in the protruding portion.

9. The electric connector according to claim 1, wherein
a first through hole of the plurality of through holes is in the protruding portion, and the first through hole has a first height, and
a second through hole of the plurality of through holes is in the thin layer portion, the second through hole has a second height, and the second height is different from the first height.

10. An electric connector, which is to be arranged between a connection terminal of a first device and a connection terminal of a second device, and is configured to electrically connect the connection terminal of the first device and the connection terminal of the second device to each other,
the electric connector comprising a composite, the composite including:
an elastic body having a plurality of through holes that penetrate therethrough in a thickness direction; and
a conductive member formed of a metal layer, which is joined to an inner wall of each of the through holes, and is configured to electrically connect the connection terminal of the first device and the connection terminal of the second device to each other,
wherein at least a part of a vicinity of at least one of distal ends of the conductive member defines a continuous hollow in a direction parallel to the through hole,
wherein the composite includes a protruding portion that protrudes in the thickness direction of the elastic body on at least the one principal surface side of the elastic body, wherein a first through hole of the plurality of through holes is in the protruding portion, and the first through hole has a first height; and
a sheet-shaped member made of a resin, which is laminated on at least a part of a thin layer portion having a thickness smaller than a thickness of the protruding portion, on at least the one principal surface side of the elastic body, the sheet-shaped member exhibits excellent heat resistance and dimensional stability, a second through hole of the plurality of through holes is in the thin layer portion, the second through hole has a second height, and the second height is different from the first height.

11. The electric connector according to claim 10, wherein the sheet-shaped member directly contacts at least one conductive member.

12. The electric connector according to claim 10, further comprising a non-conductive region, which is formed between adjacent conductive regions of a plurality of conductive regions, includes at least one of the plurality of through holes, each of the through holes in the non-conductive region being free of the conductive member, and the non-conductive region is in the protruding portion.

* * * * *